United States Patent
Reznicek et al.

(10) Patent No.: US 11,145,816 B2
(45) Date of Patent: Oct. 12, 2021

(54) RESISTIVE RANDOM ACCESS MEMORY CELLS INTEGRATED WITH VERTICAL FIELD EFFECT TRANSISTOR

(71) Applicant: International Business Machines Corporation, Armonk, NY (US)

(72) Inventors: Alexander Reznicek, Troy, NY (US); Bahman Hekmatshoartabari, White Plains, NY (US); Takashi Ando, Eastchester, NY (US); Karthik Balakrishnan, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 48 days.

(21) Appl. No.: 16/723,217

(22) Filed: Dec. 20, 2019

(65) Prior Publication Data

US 2021/0193923 A1    Jun. 24, 2021

(51) Int. Cl.
*H01L 27/24* (2006.01)
*H01L 45/00* (2006.01)

(52) U.S. Cl.
CPC ...... *H01L 45/1608* (2013.01); *H01L 27/2454* (2013.01); *H01L 45/1206* (2013.01)

(58) Field of Classification Search
CPC .............. H01L 45/1608; H01L 27/2454; H01L 45/1206; H01L 45/04
See application file for complete search history.

(56) References Cited

U.S. PATENT DOCUMENTS

| | | | |
|---|---|---|---|
| 8,912,517 B2 | 12/2014 | Van Buskirk | |
| 9,378,818 B2 | 6/2016 | Liu | |
| 9,443,982 B1* | 9/2016 | Balakrishnan | .... H01L 29/66772 |
| 9,627,441 B2 | 4/2017 | Van Buskirk | |
| 9,698,202 B2 | 7/2017 | Takaki | |
| 9,728,542 B1* | 8/2017 | Balakrishnan | .... H01L 29/78642 |
| 9,882,125 B2 | 1/2018 | Toh | |

(Continued)

FOREIGN PATENT DOCUMENTS

| | | |
|---|---|---|
| CN | 103872067 A | 6/2014 |
| WO | 2010135172 A1 | 11/2010 |

OTHER PUBLICATIONS

"2017 IEEE International Electron Devices Meeting", Dec. 2-6, 2017, San Francisco, CA, 73 pages, <https://ieee-iedm.org/2018dev/wp-content/uploads/sites/11/2017/11/17-ap-FINAL.pdf>.

(Continued)

*Primary Examiner* — Jarrett J Stark
(74) *Attorney, Agent, or Firm* — Michael A. Petrocelli

(57) ABSTRACT

A one-transistor-two-resistor (1T2R) resistive random access memory (ReRAM) structure, and a method for forming the same, includes forming a vertical field effect transistor (VFET) including an epitaxial region located above a channel region and below a dielectric cap. The epitaxial region includes two opposing protruding regions of triangular shape bounded by <111> planes that extend horizontally beyond the channel region. A ReRAM stack is conformally deposited on the VFET. The ReRAM stack includes an oxide layer located directly above the epitaxial region, a top electrode layer directly above the oxide layer and a metal fill above the top electrode layer. Each of the two opposing protruding regions of the epitaxial region acts as a bottom electrode for the ReRAM stack.

6 Claims, 23 Drawing Sheets

(56) References Cited

U.S. PATENT DOCUMENTS

| | | | |
|---|---|---|---|
| 9,953,973 B1* | 4/2018 | Balakrishnan | ............................... H01L 21/823487 |
| 10,157,653 B1 | 12/2018 | Li | |
| 10,319,833 B1* | 6/2019 | Jagannathan | ....... H01L 29/6656 |
| 2014/0239247 A1* | 8/2014 | Park | .................... H01L 27/2463 257/4 |
| 2018/0211703 A1 | 7/2018 | Choi | |
| 2018/0323312 A1 | 11/2018 | Van Dal | |
| 2019/0198572 A1* | 6/2019 | Ando | ................ H01L 29/42376 |

OTHER PUBLICATIONS

Clermidy, et al., "Resistive memories: Which applications?", 2014 Design, Automation & Test in Europe Conference & Exhibition (DATE), 6 pages, <https://doi.org/10.7873/DATE.2014.282>.

Onkaraiah, et al., "A Hybrid CBRAM/CMOS Look-Up-Table structure for improving performance efficiency of Field-Programmable-Gate-Array", 2013 IEEE International Symposium on Circuits and Systems (ISCAS), pp. 2440-2443, <https://doi.org/10.1109/ISCAS.2013.6572372>.

Palma, et al., "Interface Engineering of Ag—GeS2-Based Conductive Bridge RAM for Reconfigurable Logic Applications", IEEE Transactions On Electron Devices, vol. 61, No. 3, Mar. 2014, pp. 793-800.

Vianello, et al., "Resistive Memories for Ultra-Low-Power embedded computing design", 2014 IEEE International Electron Devices Meeting, pp. 6.3.1-6.3.4, <https://doi.org/10.1109/IEDM.2014.7046995>.

Yang, et al., "Threshold switching selector and 1S1R integration development for 3D cross-point STT-MRAM", 2017 IEEE International Electron Devices Meeting (IEDM), pp. 38.1.1, 38.1.4, <https://ieee-iedm.org/2018dev/wp-content/uploads/sites/11/2017/11/17-ap-FINAL.pdf>.

Yasuda, et al., "Nonvolatile Configuration Memory Cell for Low Power Field Programmable Gate Array", 2011 3rd IEEE International Memory Workshop (IMW), 4 pages, <https://doi.org/10.1109/IMW.2011.5873238>.

International Search Report and Written Opinion, International Application No. PCT/IB2020/061481, International Filing Date Dec. 4, 2020, 10 pages.

* cited by examiner

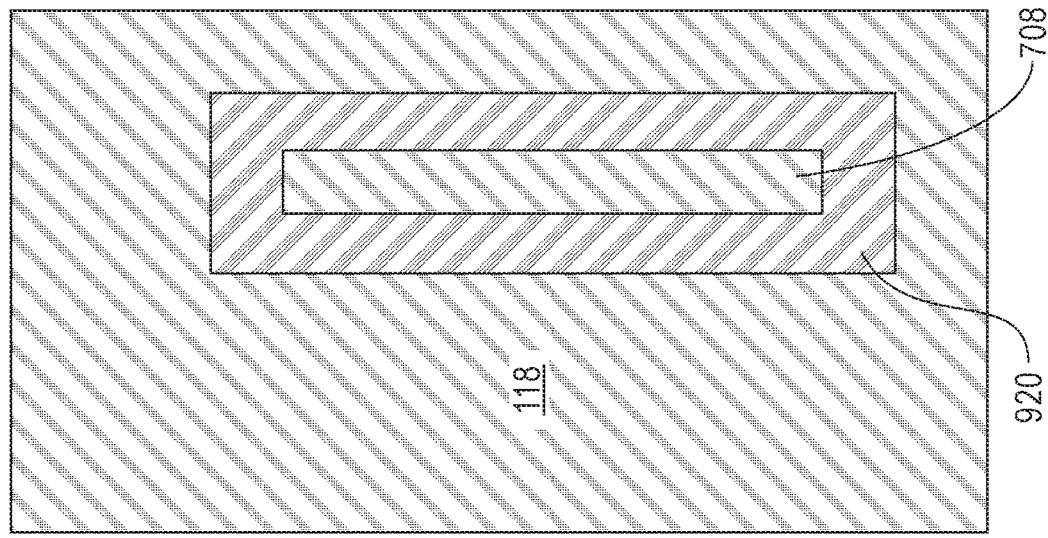
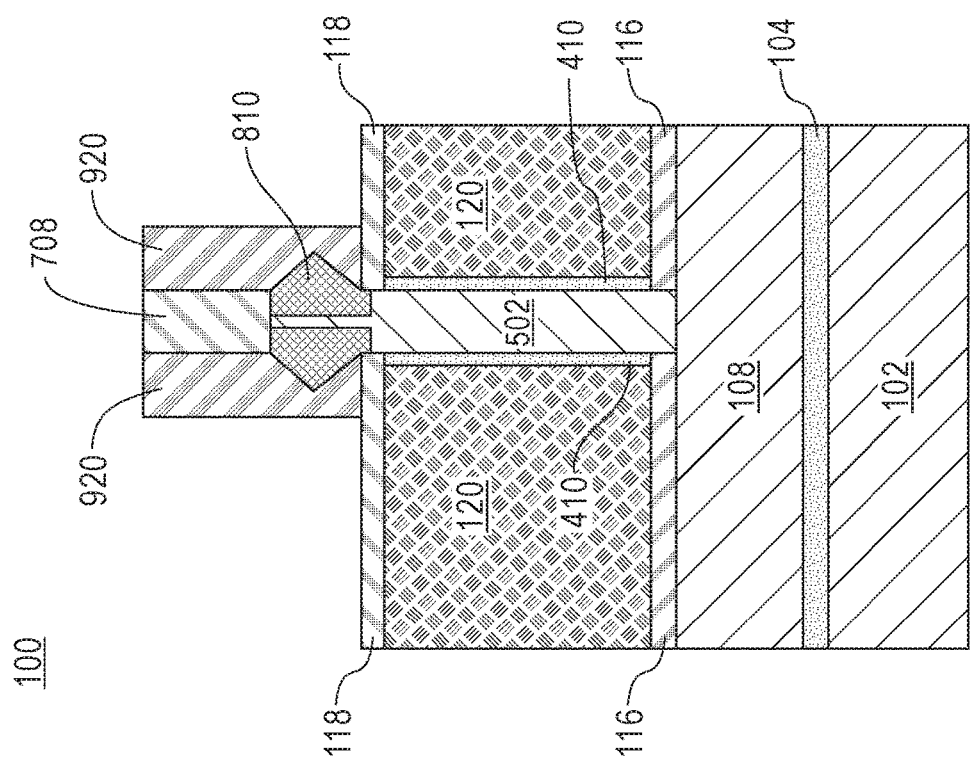
FIG. 9A
FIG. 9

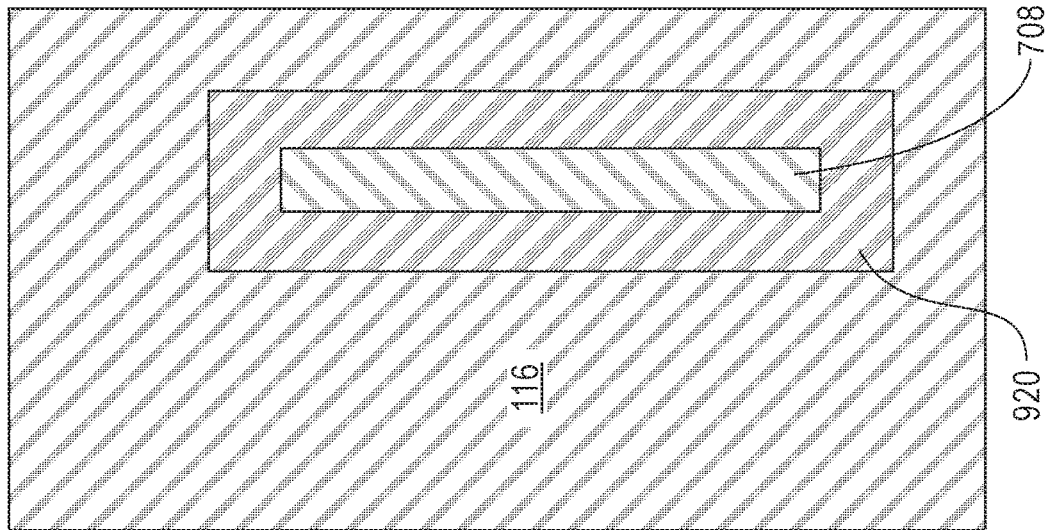
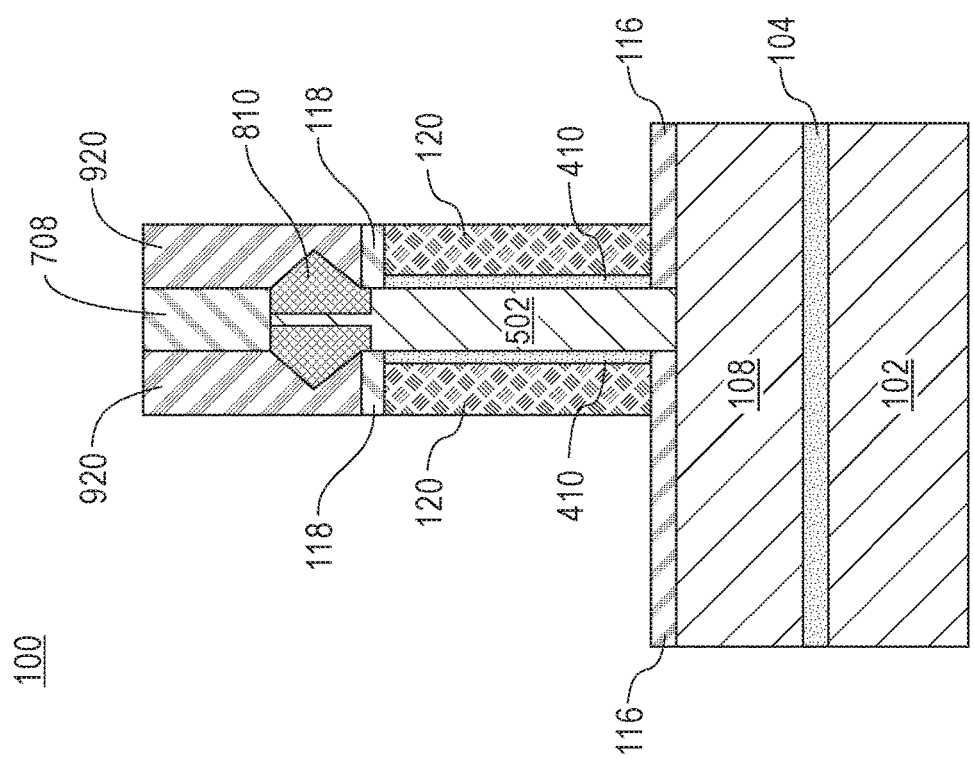

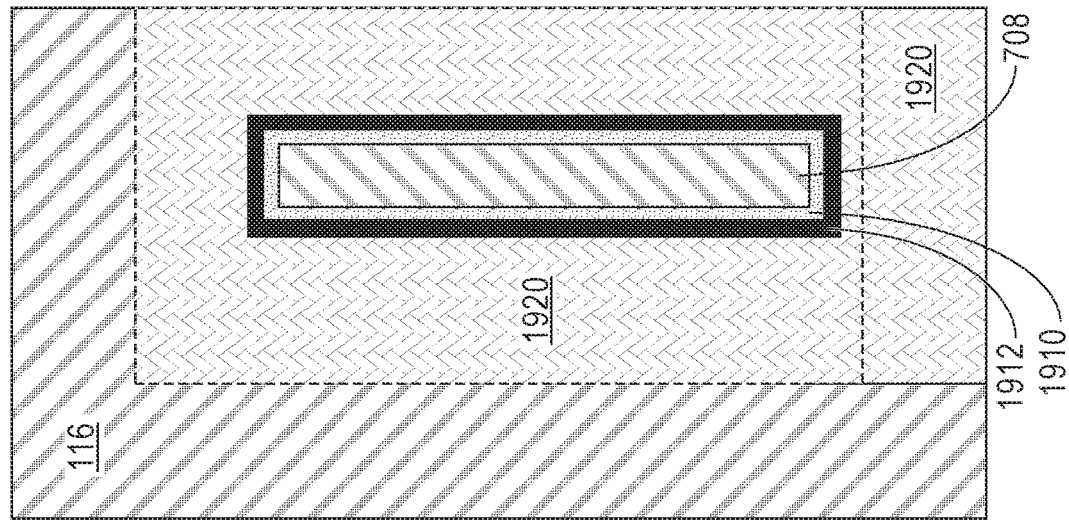
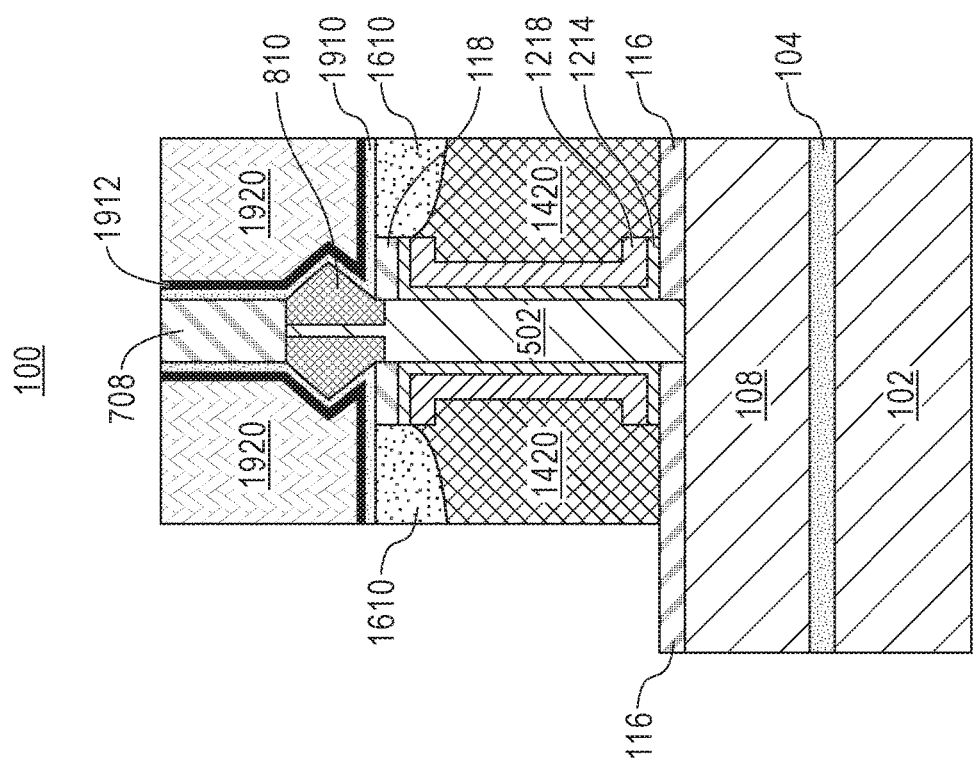

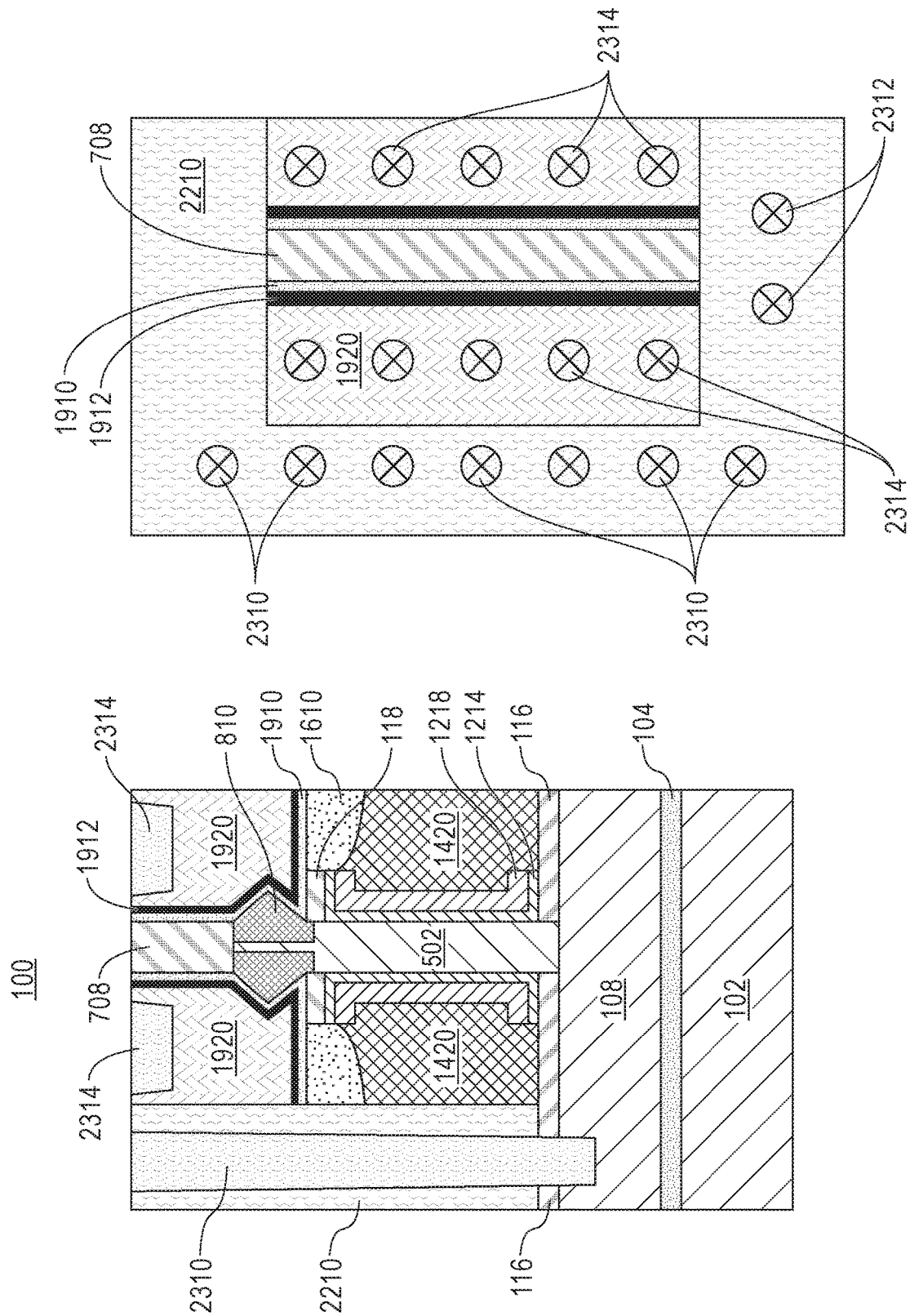

RESISTIVE RANDOM ACCESS MEMORY CELLS INTEGRATED WITH VERTICAL FIELD EFFECT TRANSISTOR

BACKGROUND

The present invention generally relates to the field of magnetic storage devices, and more particularly to integrating resistive random access memory (ReRAM) devices with a vertical field effect transistor (VFET).

ReRAM is one of the most promising technologies for non-volatile memory devices. Thanks to the low power and high speed operation, the high density CMOS-compatible integration, and the high cycling endurance, ReRAM technology is becoming the mainstream option for high-density storage arrays and novel in-memory computing systems.

The essential ReRAM mechanism is based on the formation and rupture of a nanoscale conducting filament typically formed between two electrodes that results in repeatable resistive switching between a high-resistance state and low-resistance state. A drawback of the ReRAM mechanism is that it relies on randomness, and the position of the conducting filament is not under control. Therefore, improved designs and techniques for formation of ReRAM devices would be desirable.

SUMMARY

Shortcomings of the prior art are overcome and additional advantages are provided through the provision of a method for forming a semiconductor device that includes forming a vertical field effect transistor including an epitaxial region above a channel region of the vertical field effect transistor and below a dielectric cap. The epitaxial region includes two opposing protruding regions of triangular shape that extend horizontally beyond the channel region. A resistive random access memory stack is conformally deposited on the vertical field effect transistor, the resistive random access memory stack includes an oxide layer located directly above the epitaxial region, a top electrode layer directly above the oxide layer and a metal fill above the top electrode layer. Each of the two opposing protruding regions of the epitaxial region acts as a bottom electrode for the resistive random access memory stack.

Another embodiment of the present disclosure provides a method for forming a semiconductor device that includes forming a doped source on a substrate, forming a dummy gate on the doped source, the dummy gate is arranged between a first spacer disposed on the doped source and a second spacer disposed on the dummy gate. A trench is formed in the dummy gate, the first spacer, and the second spacer to expose the doped source and an epitaxial layer is grown within the trench off the doped source to form a channel region that extends from the doped source and through the dummy gate. A top portion of the channel region is recessed to form a dielectric cap. An epitaxial region is grown on a portion of the channel region to form a source/drain region over the dummy gate and below the dielectric cap, the epitaxial region includes two opposing protruding regions of triangular shape that extend horizontally beyond the channel region. The dummy gate is replaced with a gate stack including a metal gate material that surrounds the channel region. The metal gate material is etched to expose the epitaxial region. A first interlevel dielectric layer is formed to separate the epitaxial region from the metal gate material, and an oxide layer and top electrode are conformally deposited above the first interlevel dielectric layer, outer surfaces of the epitaxial region and sidewalls of the dielectric cap.

Another embodiment of the present disclosure provides a semiconductor device that includes a vertical field effect transistor including an epitaxial region located above a channel region of the vertical field effect transistor and below a dielectric cap, the epitaxial region includes two opposing protruding regions of triangular shape that extend horizontally beyond the channel region, and a resistive random access memory structure on each side of the epitaxial region and the dielectric cap. The resistive random access memory structure comprises an oxide layer directly above outer surfaces of the epitaxial region and sidewalls of the dielectric cap, a top electrode layer directly above the oxide layer and a metal fill above the top electrode layer. Each of the two protruding regions of the epitaxial region acts as a bottom electrode for the resistive random access memory structures.

BRIEF DESCRIPTION OF THE DRAWINGS

The following detailed description, given by way of example and not intended to limit the invention solely thereto, will best be appreciated in conjunction with the accompanying drawings, in which:

FIG. 9 is a cross-sectional view of the semiconductor device after depositing a spacer on the epitaxial region, according to an embodiment of the present disclosure.

FIG. 9A is a top view of FIG. 9.

FIG. 10 is a cross-sectional view of the semiconductor device after removing portions of the second spacer and dummy gate, according to an embodiment of the present disclosure.

FIG. 10A is a top view of FIG. 10.

FIG. 20 is a cross-sectional view of the semiconductor device 100 after performing gate lithography and etching, according to an embodiment of the present disclosure.

FIG. 20A is a top view of FIG. 20.

FIG. 23 is a cross-sectional view of the semiconductor device after forming source/drain contacts, gate contacts and ReRAM contacts, according to an embodiment of the present disclosure.

FIG. 23A is a top view of FIG. 23.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1A:
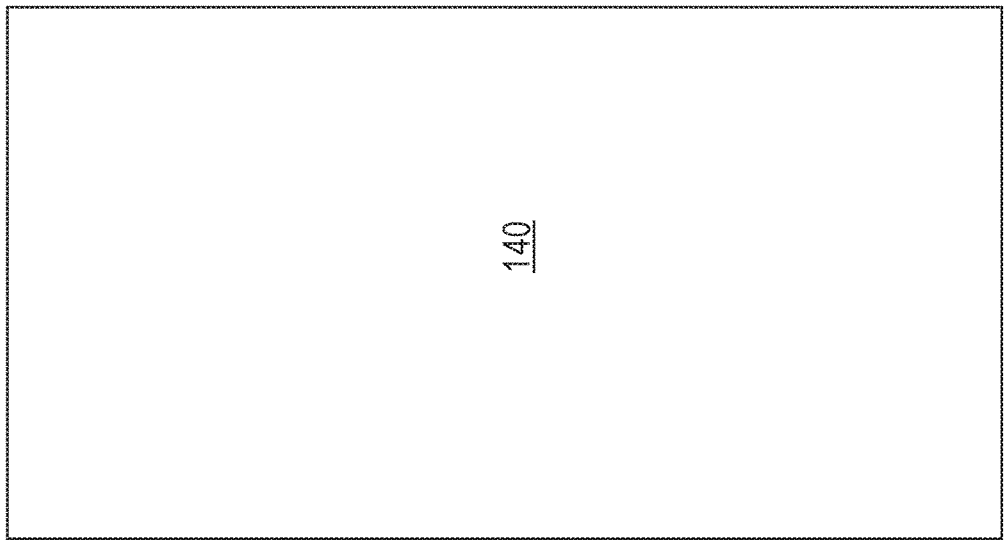
FIG. 1A is a top view of FIG. 1.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

ReRAM structures typically include a top electrode, a bottom electrode, and an oxide layer positioned between the two electrodes. In oxide ReRAMs, electroforming of current conducting filament is needed. This process relies on randomness which hinders controlling the position of the current conducting filament of the oxide ReRAM. This results in a higher forming voltage as the ReRAM cell is scaled and a higher device variability.

Embodiments of the present invention generally relates to the field of magnetic storage devices, and more particularly to integrating resistive random access memory (ReRAM) devices with a vertical field effect transistor (VFET). The proposed embodiments provide a method and associated structure for fabricating a one-transistor-two-resistor (1T2R)

ReRAM structure that may reduce randomness of electro-forming of the current conducting filament while improving device scalability. Specifically, the proposed embodiments provide a vertically-stacked 1T2R non-volatile memory cell for field-programmable gate arrays (FPGAs) in which two oxide ReRAMs are co-integrated with one vertical field effect transistor using portions of the top source/drain region of the VFET as bottom electrode for the ReRAM structures. One way to form the one-transistor-two-resistor ReRAM structure includes forming a VFET device including a faceted epitaxial region with protruding outer portions, forming a ReRAM stack directly above the epitaxial region, the ReRAM stack includes an oxide layer above an electrode layer and a metal fill above the electrode layer, the oxide layer is in direct contact with the protruding outer portions of the faceted epitaxial region that act as the bottom electrode of the adjacent ReRAM elements. An embodiment by which the one-transistor-two-resistor ReRAM structure can be formed is described in detailed below by referring to the accompanying drawings in FIGS. 1-23A.

Figure 1:
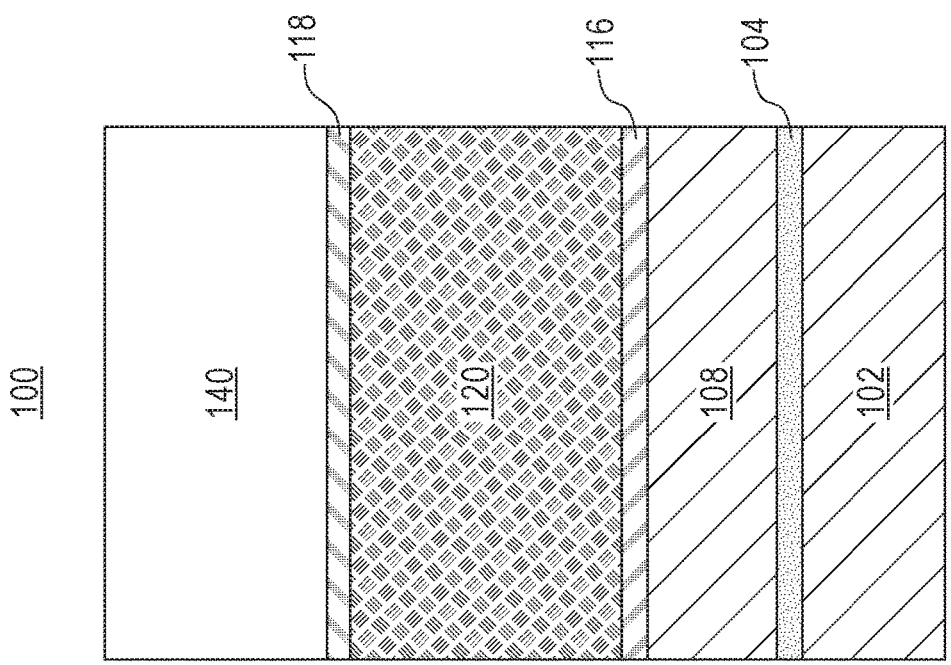
FIG. 1 is a cross-sectional view of a semiconductor device at an intermediate step during a method of making a vertical field effect transistor (VFET), according to an embodiment of the present disclosure.

Referring now to FIG. 1, a cross-sectional view of a semiconductor device 100 at an intermediate step during a method of making a vertical field effect transistor (VFET) is shown, according to an embodiment of the present disclosure. In this embodiment, FIG. 1A is a top view of the semiconductor device 100.

At this point of the manufacturing process, the semiconductor device 100 includes a dummy gate 120 and a dielectric capping layer 140 arranged on a semiconductor substrate 102 (hereinafter "substrate"). The substrate 102 includes, for example, a bulk semiconductor substrate. The substrate 102 includes one or more semiconductor materials. Non-limiting examples of suitable semiconductor materials for the substrate 102 may include silicon (Si), strained Si, silicon carbide (SiC), germanium (Ge), silicon germanium (SiGe), silicon-germanium-carbon (SiGeC), Si alloys, Ge alloys, III-V materials (e.g., gallium arsenide (GaAs), indium arsenide (InAs), indium phosphide (InP), or aluminum arsenide (AlAs)), II-VI materials (e.g., cadmium selenide (CdSe), cadmium sulfide (CdS), cadmium telluride (CdTe), zinc oxide (ZnO), zinc selenide (ZnSe), zinc sulfide (ZnS), or zinc telluride (ZnTe)), or any combination thereof. In an embodiment, the substrate 102 may include germanium.

A doped source 108 is arranged on the substrate 102 over a counter-doped layer 104. The doped source 108 and the counter-doped layer 104 are formed on the substrate 102 by incorporating dopants into the substrate 102 or via epitaxial growth. According to an embodiment, the doped source 108 is heavily doped with a dopant, which may be a p-type dopant (e.g., boron or gallium) or an n-type dopant (e.g., phosphorus or arsenic). The counter-doped layer 104 includes a dopant that is different/opposite than the dopant in the doped source 108. For example, when the doped source 108 includes a p-type dopant, the counter-doped layer 104 includes an n-type dopant, and when the doped source 108 includes an n-type dopant, the counter-doped layer 104 includes a p-type dopant. The doped source 108 is heavily doped, including a dopant concentration varying between approximately $10^{19}$ atoms/cm$^3$ to approximately $10^{22}$ atoms/cm$^3$. A thickness of the counter-doped layer may be in a range varying from approximately 5 to approximately 50 nm, or from approximately 10 to approximately 20 nm. A thickness of the doped source 108 may be in a range varying from approximately 50 to approximately 250 nm, or from approximately 100 to approximately 200 nm.

The dummy gate 120 is disposed on the doped source 108 between a first spacer 116 and a second spacer 118. The first spacer 116 is deposited on the doped source 108, the dummy gate 120 is deposited on the first spacer 116, and the second spacer 118 is deposited on the dummy gate 120. The first spacer 116 and the second spacer 118 may include an insulating material, for example, silicon dioxide, silicon nitride, SiOCN, or SiBCN. Other non-limiting examples of materials for the first spacer 116 and the second spacer 118 include dielectric oxides (e.g., silicon oxide), dielectric nitrides (e.g., silicon nitride), dielectric oxynitrides, or any combination thereof. Materials forming the first spacer 116 and the second spacer 118 are deposited by a standard deposition processes including, for example, chemical vapor deposition (CVD) or physical vapor deposition (PVD). The first spacer 116 and the second spacer 118 may each have a thickness varying between approximately 3 nm to approximately 15 nm, or between approximately 5 nm to approximately 10 nm.

The dummy gate 120 includes a sacrificial gate material, for example, amorphous silicon (aSi) or polycrystalline silicon (polysilicon). The sacrificial gate material may be deposited by a deposition process, including, but not limited to, PVD, CVD, plasma enhanced chemical vapor deposition (PECVD), inductively coupled plasma chemical vapor deposition (ICP CVD), or any combination thereof. The sacrificial gate material forming the dummy gate 120 has a thickness varying between approximately 8 nm to approximately 100 nm, or between approximately 10 nm to approximately 30 nm.

The dielectric capping layer 140 is deposited on the second spacer 118 over the dummy gate 120. Non-limiting examples of materials for the dielectric capping layer 140 include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof. The dielectric capping layer 140 has a thickness in a range varying from approximately 30 nm to approximately 200 nm, or from approximately 50 nm to approximately 100 nm.

Figure 2A:
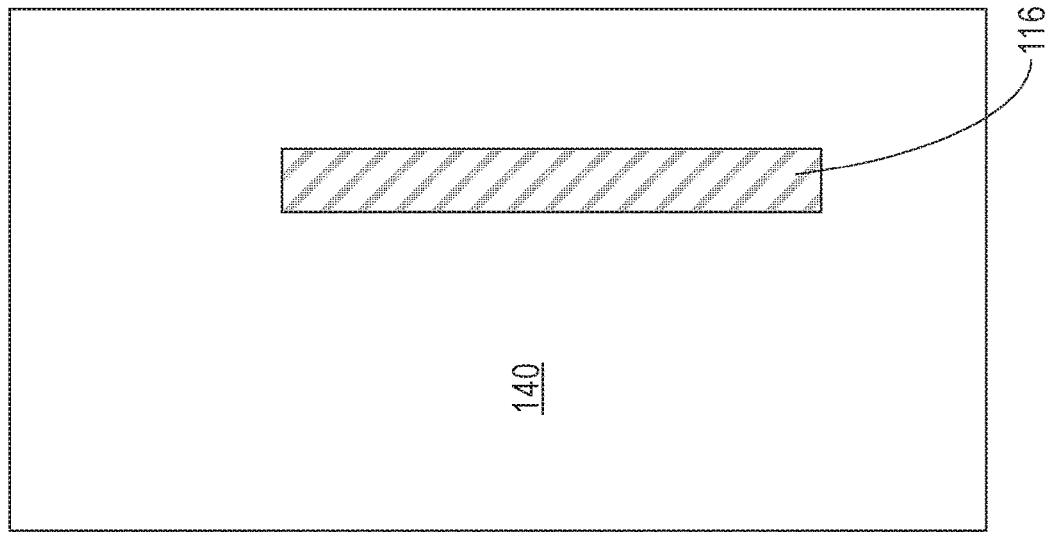
FIG. 2A is a top view of FIG. 2.
Figure 2:
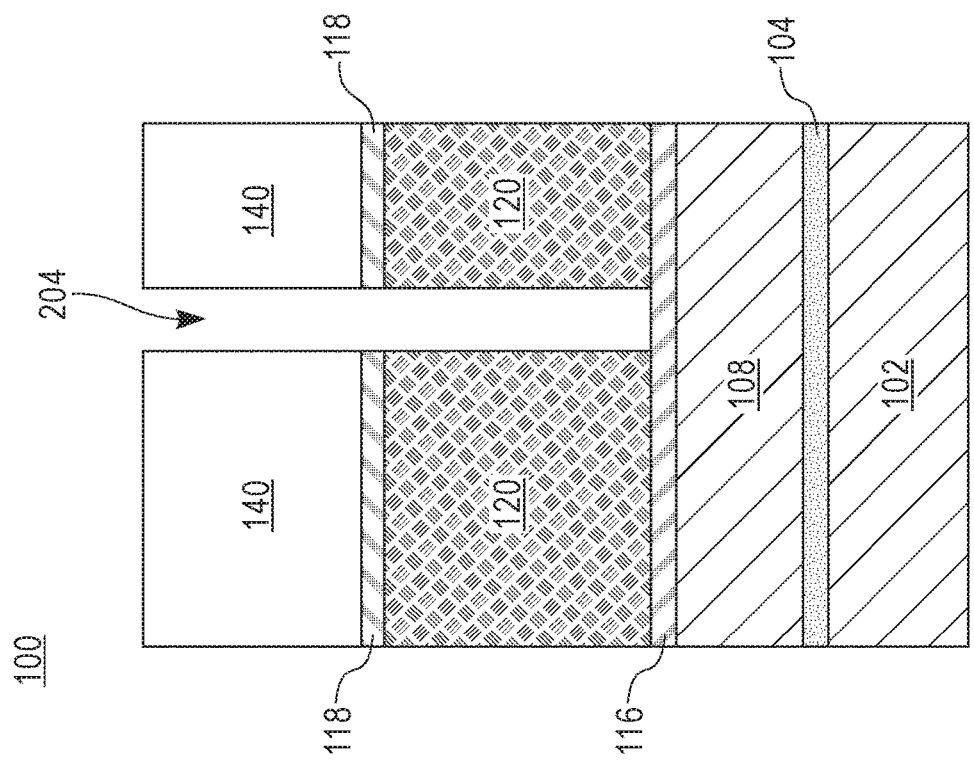
FIG. 2 is a cross-sectional view of the semiconductor device illustrating forming a trench through a dielectric capping layer, a second spacer, and a dummy gate, according to an embodiment of the present disclosure.

Referring now to FIG. 2, a cross-sectional view of the semiconductor device 100 illustrating forming a trench 204 through the dielectric capping layer 140, second spacer 118, and the dummy gate 120 to expose the first spacer 116 is shown, according to an embodiment of the present disclosure. In this embodiment, FIG. 2A is a top view of the semiconductor device 100.

The trench 204 extends from a top surface of the dielectric capping layer 140 to a top surface of the first spacer 116, exposing the first spacer 116. The trench 204 is formed by performing an etch process that is selective to (will not substantially remove) the material forming the first spacer 116. The etch process may be, for example, a reactive ion etch (RIE). As known by those skilled in the art, multiple etching processes can be performed to form the trench 204. For example, a first etching process is performed to remove a portion of the dielectric capping layer 140 selective to the material of the second spacer 118. A second etching process is then performed to remove a portion of the second spacer 118, which underlies the portion of the trench 204 formed from the first etching process, selective to the material of the dummy gate 120. A third etching process is then performed to remove a portion of the dummy gate 120, which underlies the portion of the trench 204 formed from the second etching process, selective to the material of the first spacer 116. As shown in the figure, the resulting trench 204 extends through a top surface of the dielectric capping layer 140 down to a top surface of an exposed portion of the first spacer 116. The width of the trench 204 may vary from approximately 3 nm to approximately 20 nm, or from approximately 5 nm to approximately 10 nm. The depth of the trench 204 may vary from approximately 50 nm to approximately 300 nm, or from approximately 100 nm to approximately 200 nm.

Figure 3A:
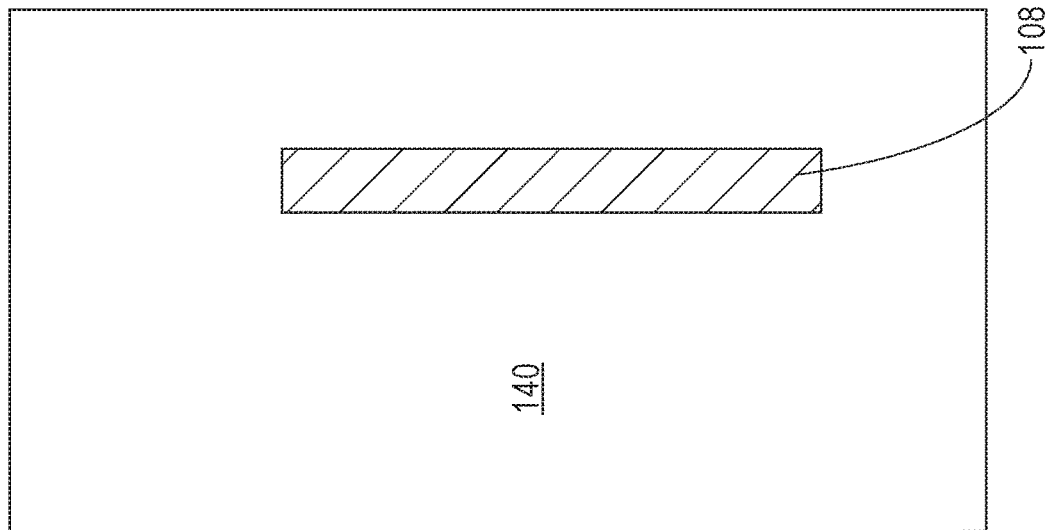
FIG. 3A is a top view of FIG. 3.
Figure 3:
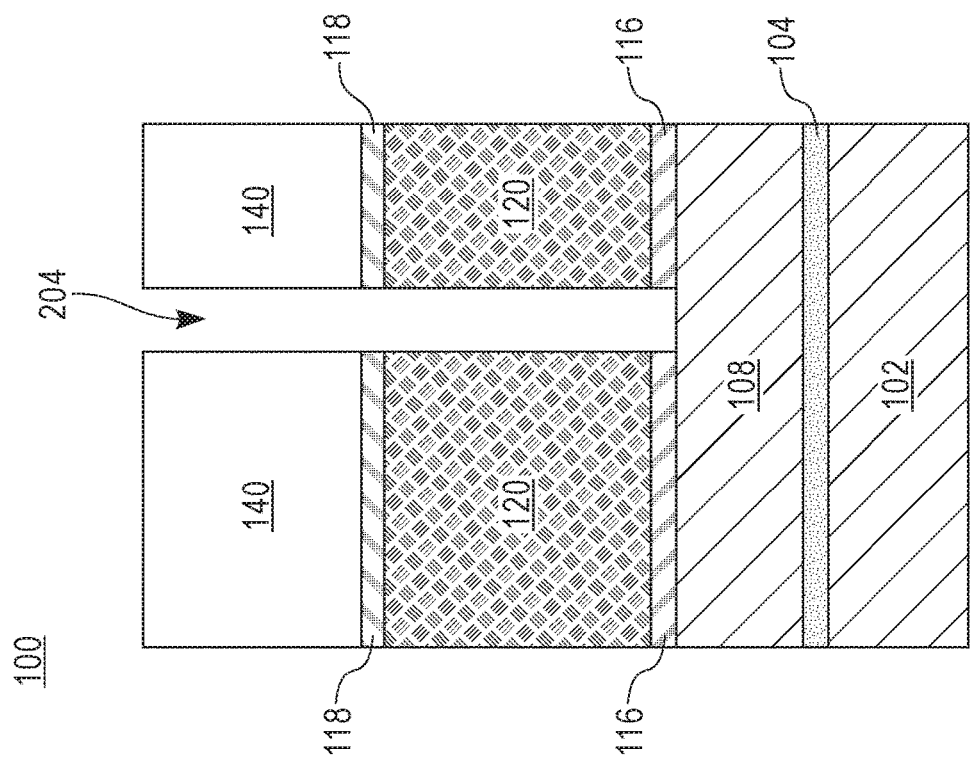
FIG. 3 is a cross-sectional view of the semiconductor device after etching through the first spacer to expose a doped source and form a self-aligned junction, according to an embodiment of the present disclosure.

Referring now to FIG. 3, a cross-sectional view of the semiconductor device 100 after etching through the first spacer 116 to expose the doped source 108 and form a self-aligned junction is shown, according to an embodiment of the present disclosure. In this embodiment, FIG. 3A is a top view of the semiconductor device 100.

The first spacer 116 may etched using a process that is selective to (will not substantially remove) the doped source 108 material. The first spacer 116 may be etched by, for example, a reactive ion etch. The exposed portion of the first spacer 116 is removed by an etching process to expose a portion of the underlying source contact layer. This creates a self-aligned junction (not shown) because a source extension can be epitaxially grown from the doped source 108 to a top surface of the first spacer 116, as will be described in detail below.

Figure 4A:
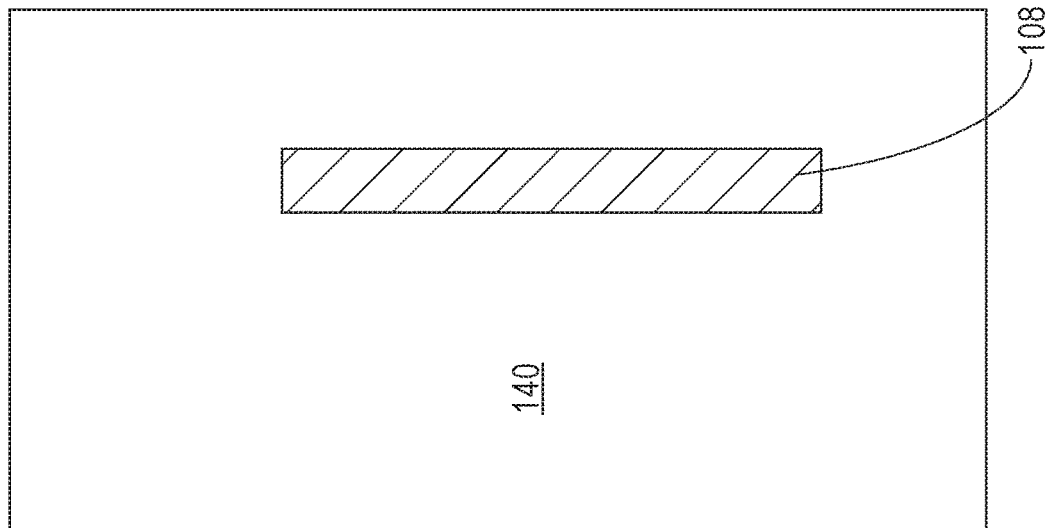
FIG. 4A is a top view of FIG. 4.
Figure 4:
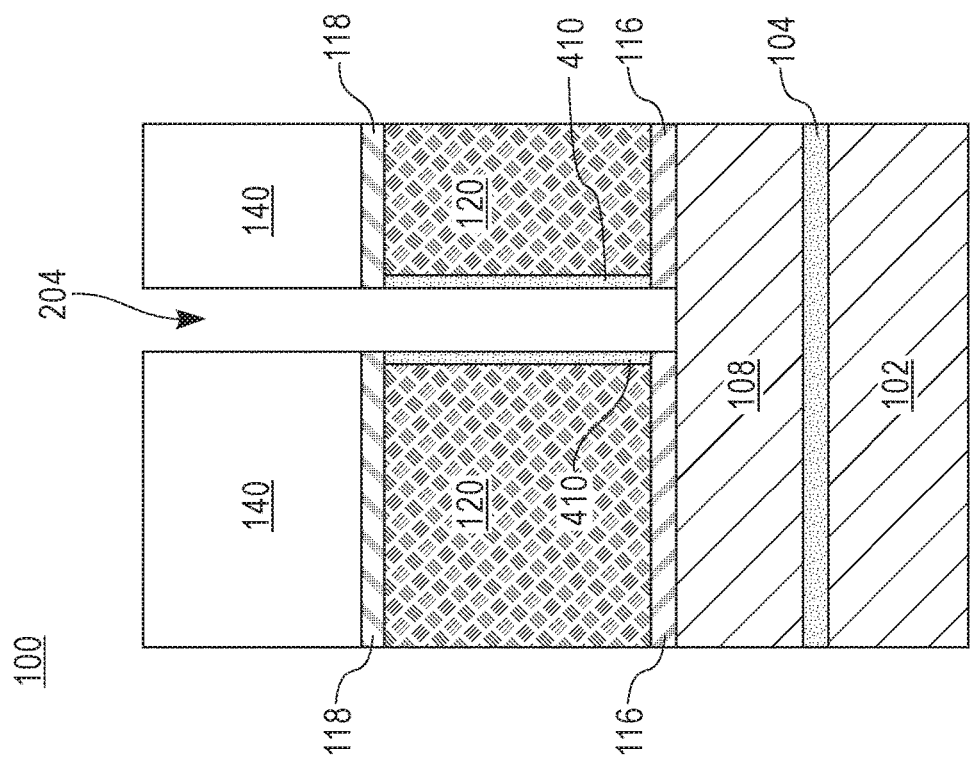
FIG. 4 is a cross-sectional view of the semiconductor device after oxidizing inner portions of the dummy gate sidewalls, according to an embodiment of the present disclosure.

Referring now to FIG. 4, a cross-sectional view of the semiconductor device 100 after oxidizing inner portions of the dummy gate 120 sidewalls is shown, according to an embodiment of the present disclosure. In this embodiment, FIG. 4A is a top view of the semiconductor device 100. The oxidation may be performed by a plasma oxidation process or other oxidation process that forms a thin oxide layer 410. In some embodiments, a portion of the first spacer 116 or the doped source 108 may also be oxidized. In such embodiments, any oxide formed in these regions is removed before performing the epitaxial growth described below in FIGS. 5-5A.

Figure 5A:
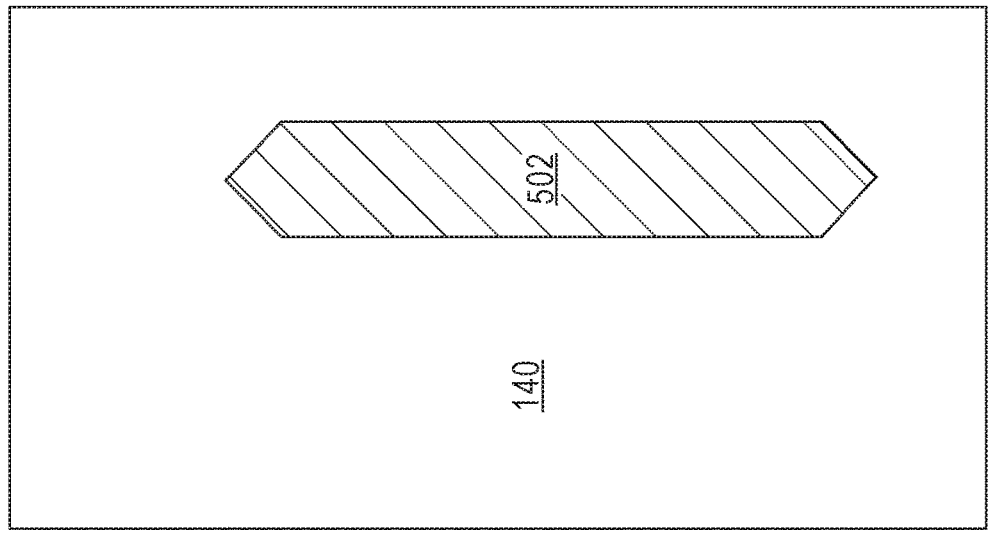
FIG. 5A is a top view of FIG. 5.
Figure 5:
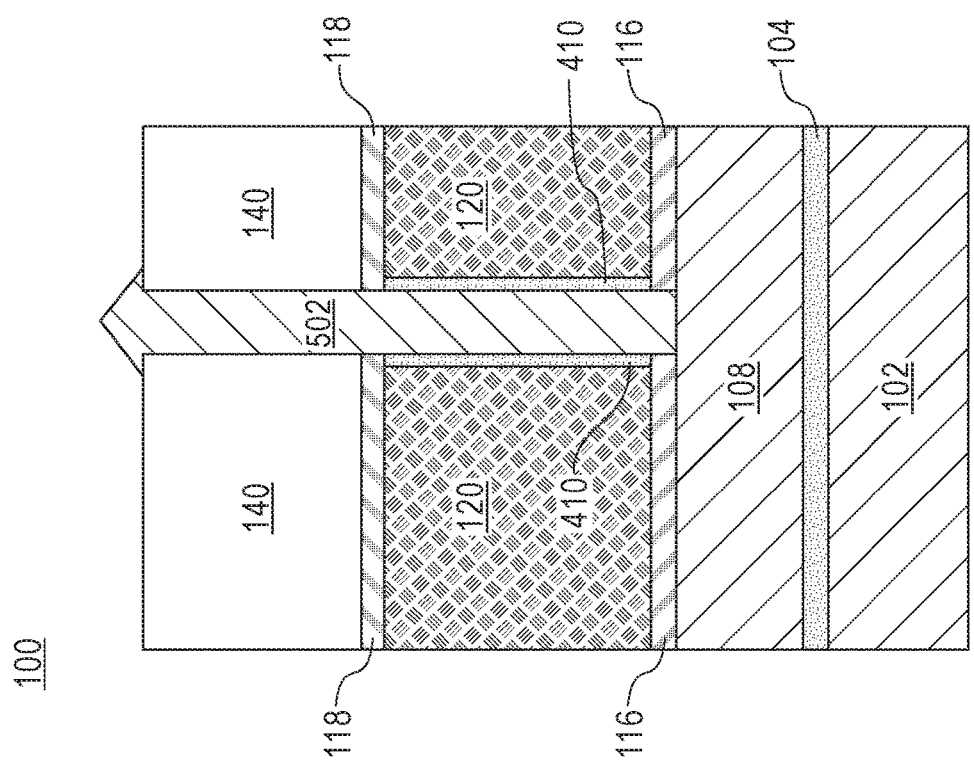
FIG. 5 is a cross-sectional view of the semiconductor device after growing an epitaxial layer off the doped source to form an epitaxial channel region, according to an embodiment of the present disclosure.

Referring now to FIG. 5, a cross-sectional view of the semiconductor device 100 after growing an epitaxial layer off the doped source 108 to form an epitaxial channel region 502 (hereinafter "channel region") is shown, according to an embodiment of the present disclosure. In this embodiment, FIG. 5A is a top view of the semiconductor device 100. As known by those skilled in the art, epitaxial growth of the channel region 502 includes an epitaxial semiconductor material, and the epitaxial growth and/or deposition processes are selective to forming on a semiconductor surface, and do not deposit material on other surfaces, such as the thin oxide layer 410, first spacer 116 or second spacer 118. The epitaxial growth of the channel region 502 extends over the dielectric capping layer 140, as shown in the figure.

The channel region 502 may be grown using a suitable epitaxial growth process including, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

Sources for the epitaxial channel material may be, for example, silicon, germanium, or a combination thereof. The gas source for the deposition of epitaxial semiconductor material may include a silicon-containing gas source, a germanium-containing gas source, or a combination thereof. For example, an epitaxial silicon layer may be deposited from a silicon gas source that is selected from the group consisting of silane, disilane, trisilane, tetrasilane, hexachlorodisilane, tetrachlorosilane, dichlorosilane, trichlorosilane, and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used.

Figure 6A:
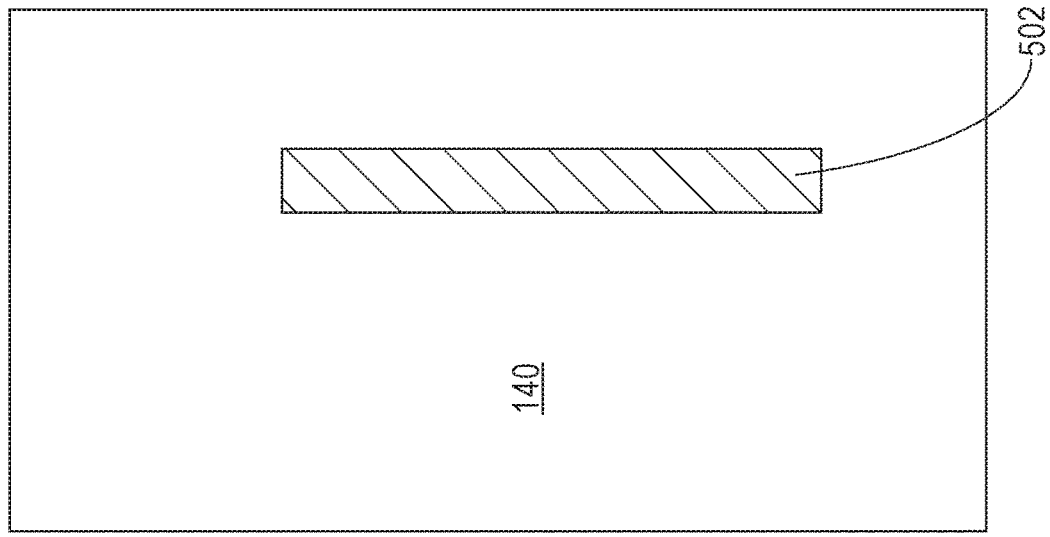
FIG. 6A is a top view of FIG. 6.
Figure 6:
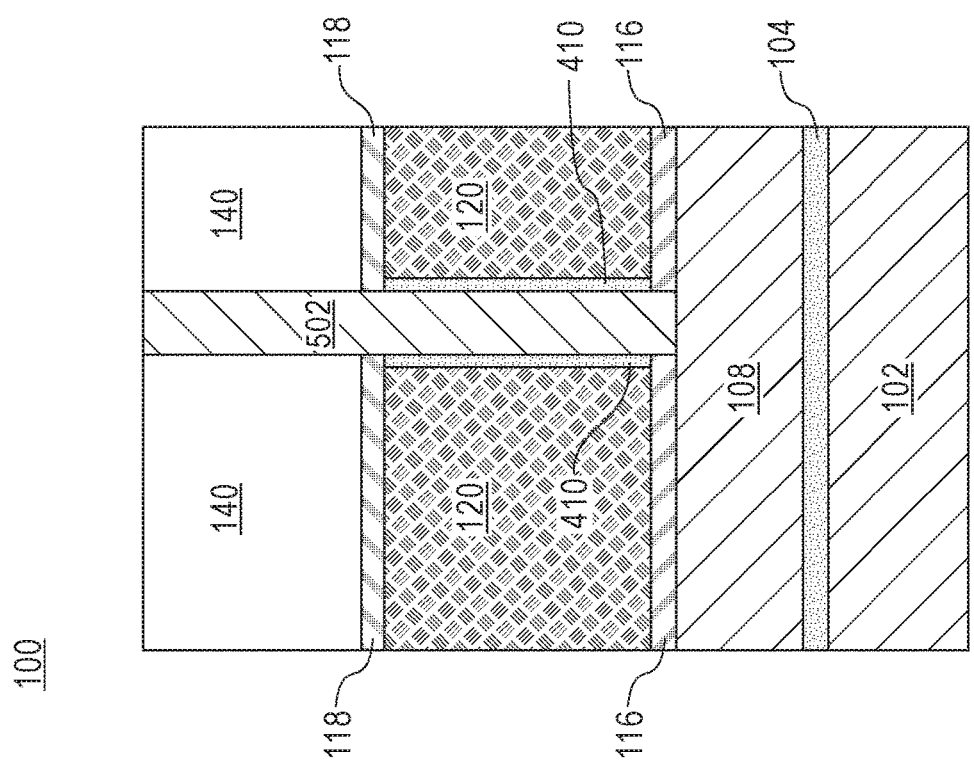
FIG. 6 is a cross-sectional view of the semiconductor device after conducting a planarization process, according to an embodiment of the present disclosure.

Referring now to FIG. 6, a cross-sectional view of the semiconductor device 100 after conducting a planarization process is shown, according to an embodiment of the present disclosure. In this embodiment, FIG. 6A is a top view of the semiconductor device 100. The planarization process conducted on the semiconductor device 100 may be a chemical mechanical planarization (CMP) process. Planarization removes excess epitaxial growth over the dielectric capping layer 140.

Figure 7A:
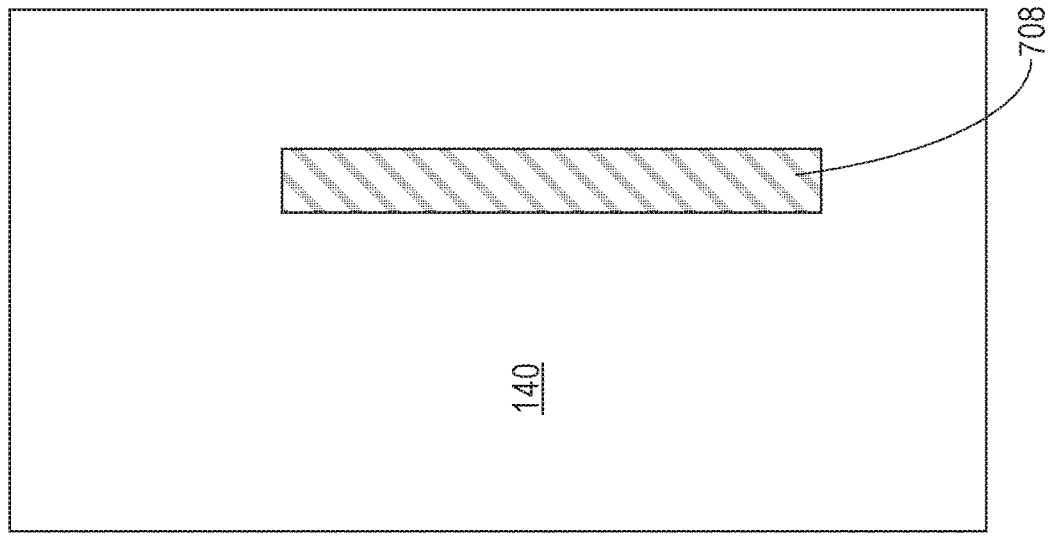
FIG. 7A is a top view of FIG. 7.
Figure 7:
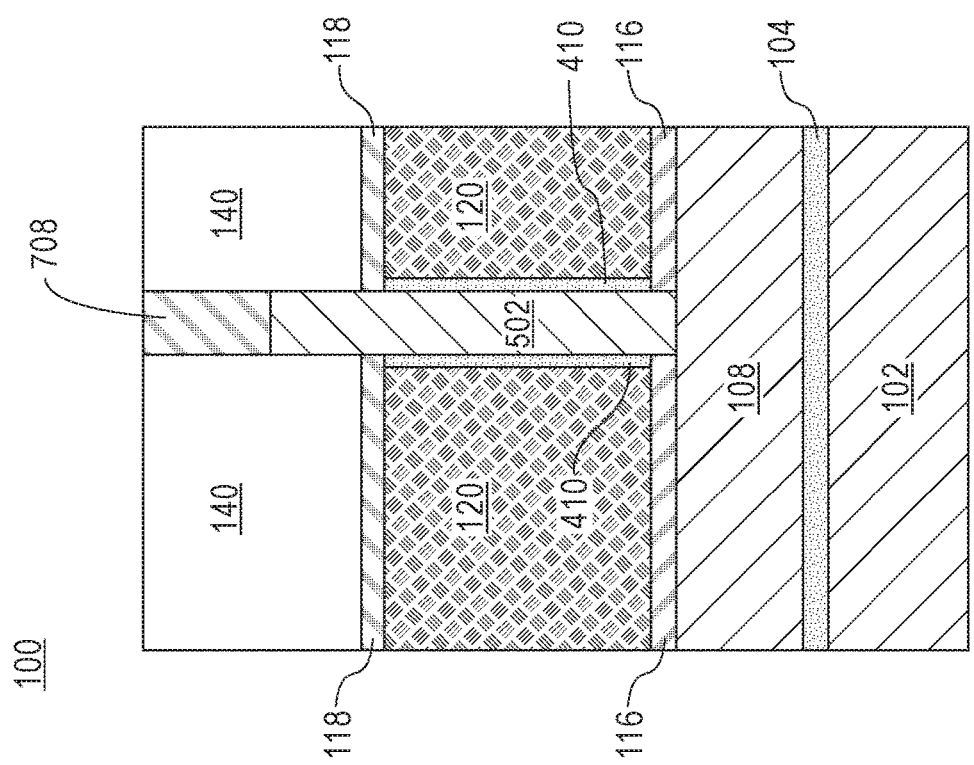
FIG. 7 is a cross-sectional view of the semiconductor device after partially recessing the channel region, filling with a dielectric material to form a dielectric cap, and planarizing the dielectric material, according to an embodiment of the present disclosure.

Referring now to FIG. 7, a cross-sectional view of the semiconductor device 100 after partially recessing the channel region 502, filling with a dielectric material to form a dielectric cap 708, and planarizing the dielectric material is shown, according to an embodiment of the present disclosure. In this embodiment, FIG. 7A is a top view of the semiconductor device 100. The channel region 502 is partially recessed to a level that is still within the dielectric capping layer 140 and over the second spacer 116. The channel region 502 is recessed by using, for example, a reactive ion etch or a wet etch process.

The recess (not shown) formed over the channel region 502 is filled with a dielectric material to form a dielectric cap 708 above the channel region 502. Formation of the dielectric cap 708 allows for the deposition of spacer 920 (FIG. 9) and self-alignment of a subsequently formed gate structure. The dielectric material forming the dielectric cap 708 may be a dielectric oxide (e.g., silicon oxide), a dielectric nitride (e.g., silicon nitride), a dielectric oxynitride, or any combination thereof. The dielectric material forming the dielectric cap 708 is deposited by standard deposition processes such as, for example, CVD or PVD. After deposition, excess dielectric material is planarized, by for example, CMP.

Figure 8A:
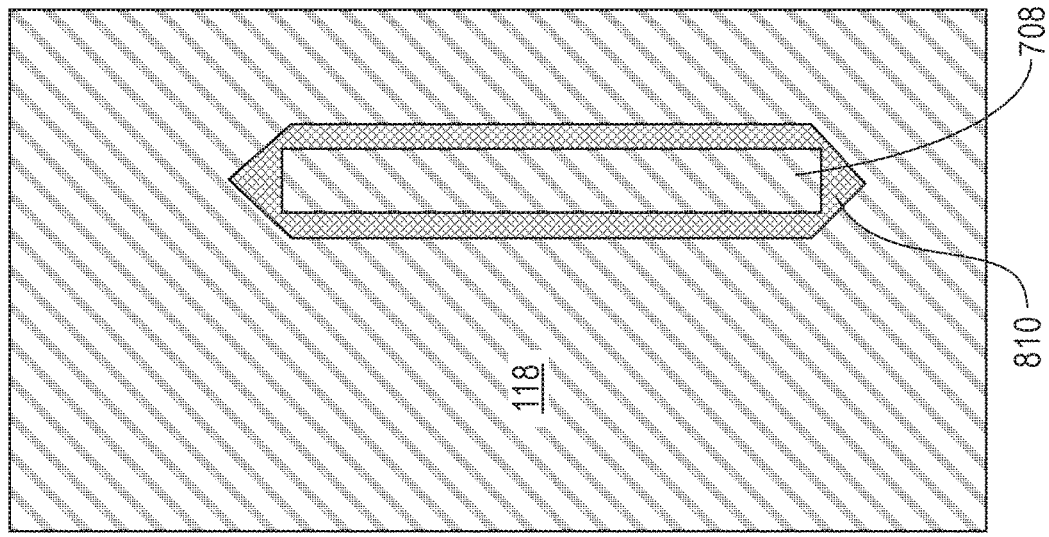
FIG. 8A is a top view of FIG. 8.
Figure 8:
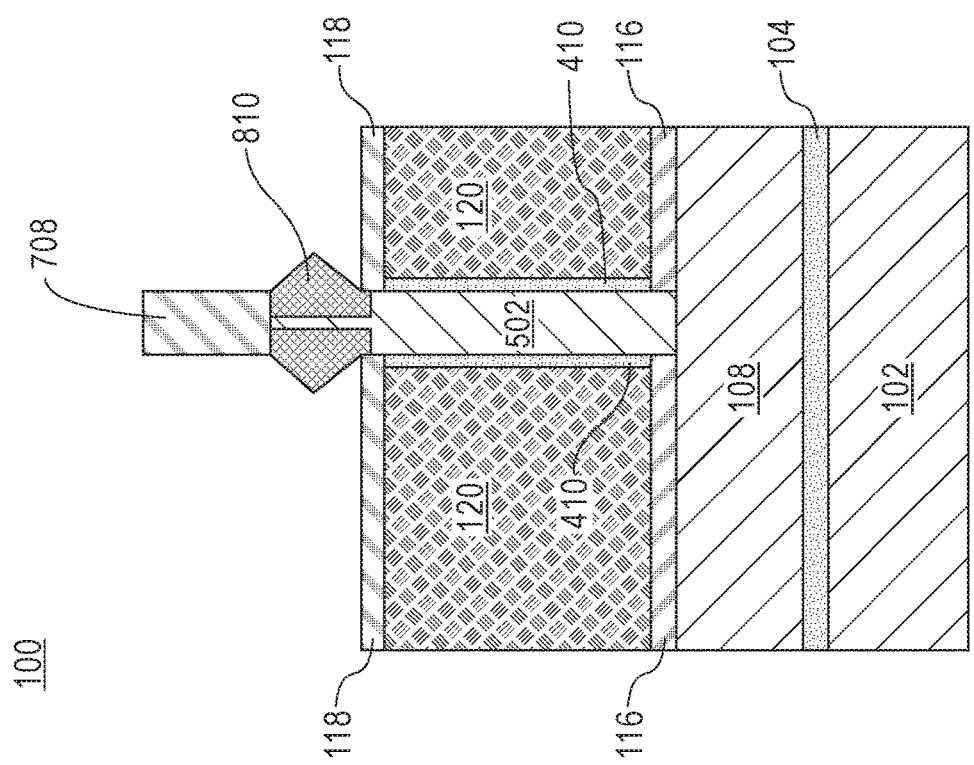
FIG. 8 is a cross-sectional view of the semiconductor device after removing the dielectric capping layer and forming an epitaxial region on the channel region to form a source/drain region, according to an embodiment of the present disclosure.

Referring now to FIG. 8, a cross-sectional view of the semiconductor device 100 after removing the dielectric capping layer 140 and forming an epitaxial region 810 on the channel region 502 to form a source/drain region is shown, according to an embodiment of the present disclosure. In this embodiment, FIG. 8A is a top view of the semiconductor device 100.

The epitaxial region 810 is arranged between the dielectric cap 708 and the channel region 502. As known by those skilled in the art, a portion of the channel region 502 over the second spacer 118 may be recessed along sidewalls before forming the epitaxial region 810. The epitaxial region 810 forms a source/drain region of the semiconductor device 100 (i.e., VFET device). Epitaxial growth of the epitaxial region 810 may be performed as described above in FIGS. 5-5A.

It should be noted, the diamond-shaped faceting effect observed in the epitaxial region 810 is the result of differential semiconductor growth along different crystallographic planes. The faceted epitaxial growth eventually slow down to very low growth rates and "terminates" at the set of crystal planes with the slowest growth rate (i.e. <111> planes), and therefore the resulting semiconductor structures have surfaces oriented in such crystal planes with the slowest semiconductor growth rate. The epitaxial region 810, as depicted in the figure, include two (opposing) protruding regions or portions of triangular shape (bound by <111> planes) that extend horizontally beyond the channel region 502. As will be described below, this geometry may enhance hole/electron mobility towards the protruding regions which may be advantageous for ReRAM performance. Various processing parameters, including the growth temperature, the growth pressure, the flow rates of the processing gases, etc., can be readily adjusted to modulate the relative growth rates along different sets of crystal planes and thereby control the surface orientations of the resulting semiconductor structures.

Referring now to FIG. 9, a cross-sectional view of the semiconductor device 100 after depositing a spacer 920 on the epitaxial region 810 is shown, according to an embodiment of the present disclosure. In this embodiment, FIG. 9A is a top view of the semiconductor device 100.

The spacer 920 protects the epitaxial region 810 during subsequent processing steps. The spacer 920 is also disposed on a sidewall of the dielectric cap 708. The spacer 920 includes an insulating material, for example, dielectric oxides (e.g., silicon oxide), dielectric nitrides (e.g., silicon nitride), dielectric oxynitrides, or any combination thereof. The spacer 920 material is deposited by standard deposition processes such as, for example, CVD or PVD. The spacer material may be etched by a dry etch process, for example, a RIE process, such that it covers the epitaxial region 810 and is removed from a surface of the dielectric cap 708 and the second spacer 118. The spacer 920 has a width varying from approximately 5 nm to approximately 50 nm, or from approximately 15 nm to approximately 30 nm.

Referring now to FIG. 10, a cross-sectional view of the semiconductor device 100 after removing portions of the second spacer 118 and dummy gate 120 is shown, according to an embodiment of the present disclosure. In this embodiment, FIG. 10A is a top view of the semiconductor device 100. The second spacer 118 and the dummy gate 120 are recessed to removed portions that extend horizontally beyond the spacer 920. An etch process that is selective to (will not substantially remove) the first spacer 116 is performed. The etch process may be a dry etch process, such as an RIE process.

Figure 11A:
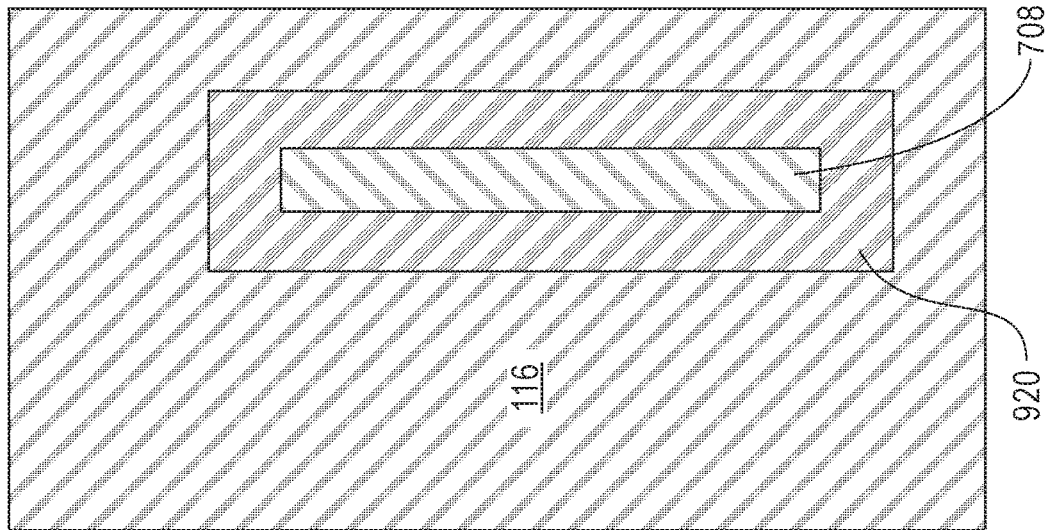
FIG. 11A is a top view of FIG. 11.
Figure 11:
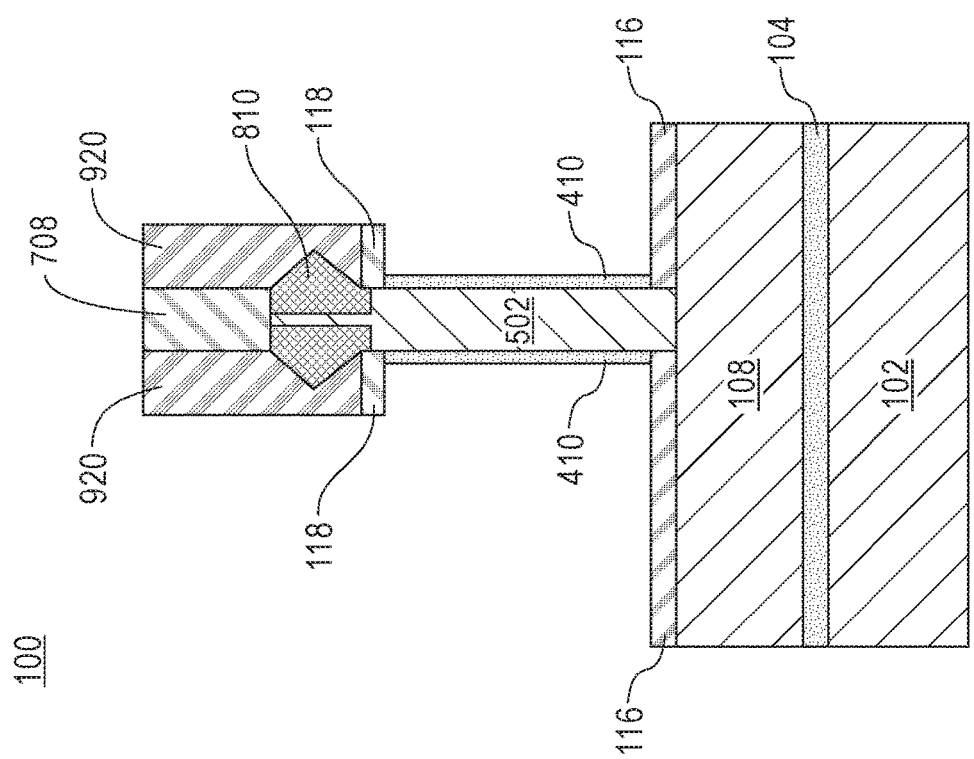
FIG. 11 is a cross-sectional view of the semiconductor device after removing remaining portions of the dummy gate beneath the spacer to expose the thin oxide layer, according to an embodiment of the present disclosure.

Referring now to FIG. 11, a cross-sectional view of the semiconductor device 100 after removing remaining portions of the dummy gate 120 beneath the spacer 920 to expose the thin oxide layer 410 is shown, according to an embodiment of the present disclosure. In this embodiment, FIG. 11A is a top view of the semiconductor device 100. The remaining portions of the dummy gate 120 may be removed by a wet etch process such as, for example, a process that includes hot ammonia.

Figure 12A:
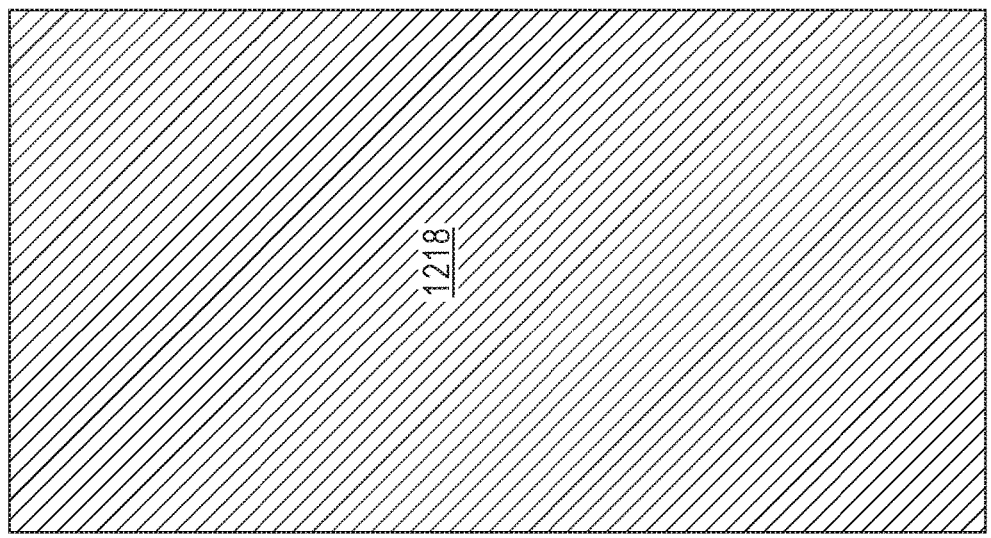
FIG. 12A is a top view of FIG. 12.
Figure 12:
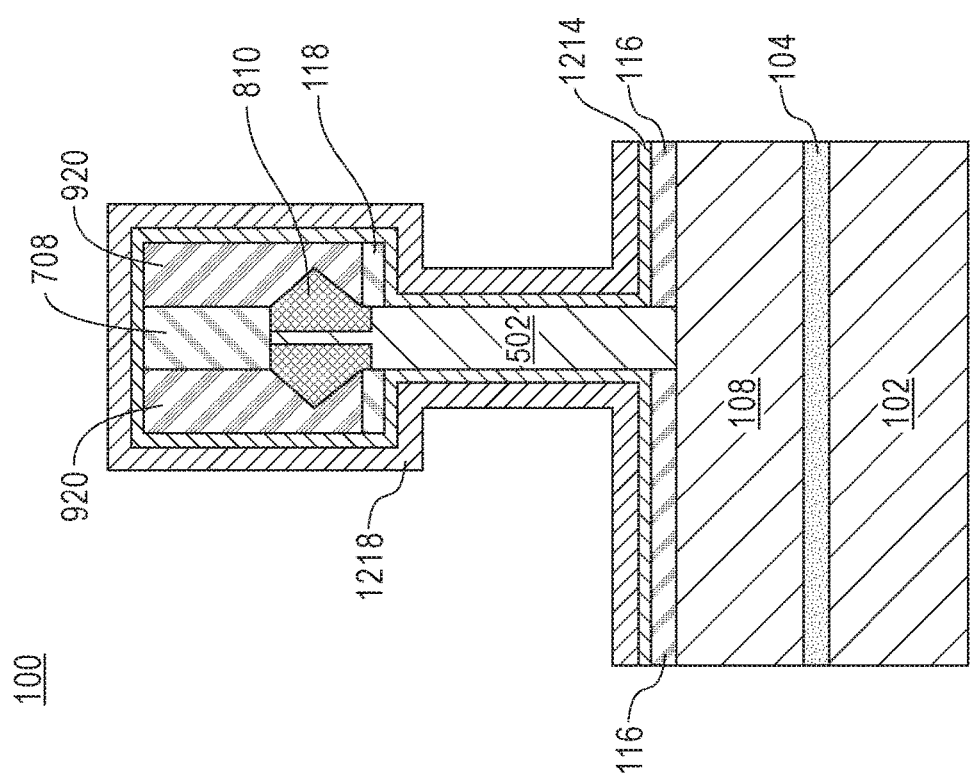
FIG. 12 is a cross-sectional view of the semiconductor device after removing the thin oxide layer and conformally depositing a gate dielectric material and a work function metal, according to an embodiment of the present disclosure.

Referring now to FIG. 12, a cross-sectional view of the semiconductor device 100 after removing the thin oxide layer 410 and conformally depositing a gate dielectric material 1214 and a work function metal 1218 is shown, according to an embodiment of the present disclosure. In this embodiment, FIG. 12A is a top view of the semiconductor device 100. The gate dielectric material 1214 and the work function metal 1218 form a portion of the gate stack that replaces the dummy gate 120. The gate dielectric material 1214 and the work function metal 1218 are disposed on the first spacer 116, the channel region 502, the spacer 920, and remaining portions of the second spacer 118 beneath the epitaxial region 810.

The gate dielectric material(s) 1214 can be a dielectric material having a dielectric constant greater than 3.9, 7.0, or 10.0. Non-limiting examples of suitable materials for the gate dielectric material 1214 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric material 1214 may be formed by suitable deposition processes including, for example, CVD, PVD, PECVD, ALD, evaporation, chemical solution deposition, or other like processes. The thickness of the gate dielectric material 1214 may vary depending on the deposition process as well as the composition and number of high-k dielectric materials used.

The work function metal(s) 1218 may be disposed over the gate dielectric material 1214. The type of work function metal(s) 1218 depends on the type of transistor. Non-limiting examples of suitable work function metals 1218 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) 1218 may be deposited by a suitable deposition process, for example, CVD, PECVD, PVD, plating, thermal or e-beam evaporation, and sputtering.

Figure 13A:
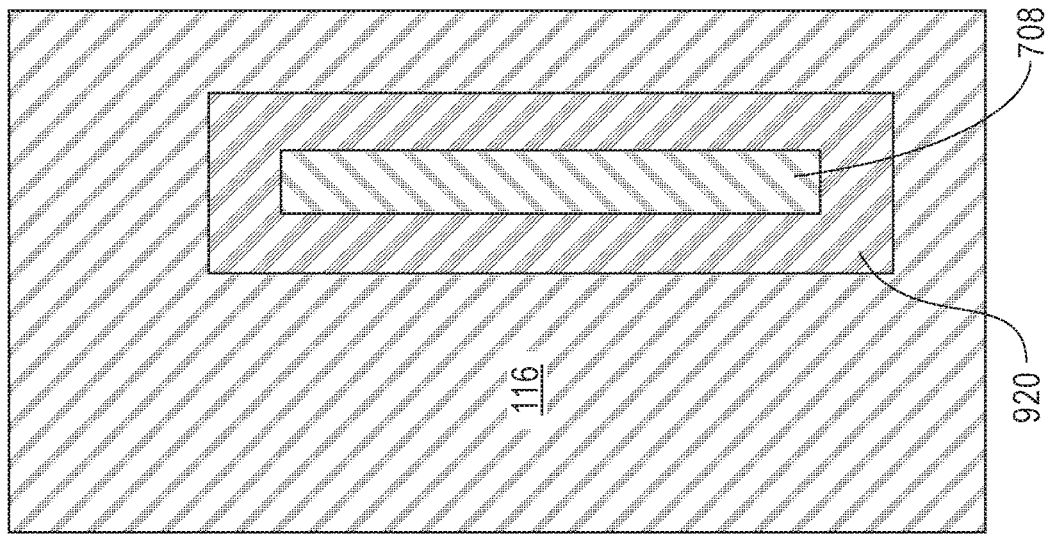
FIG. 13A is a top view of FIG. 13.
Figure 13:
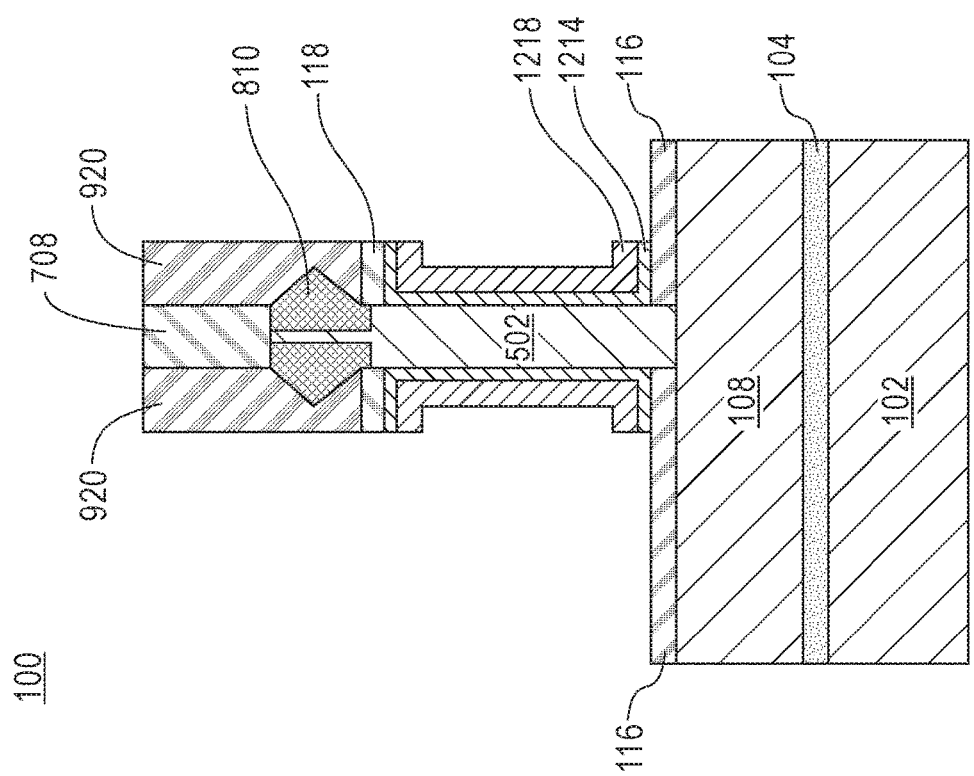
FIG. 13 is a cross-sectional view of the semiconductor device after etching the gate dielectric material and the work function metal, according to an embodiment of the present disclosure.

Referring now to FIG. 13, a cross-sectional view of the semiconductor device 100 after etching the gate dielectric material 1214 and the work function metal 1218 is shown, according to an embodiment of the present disclosure. In this embodiment, FIG. 13A is a top view of the semiconductor device 100. The gate dielectric material 1214 and the work function metal 1218 are recessed to removed portions that extend horizontally beyond the spacer 920. An etch process that is selective to (will not substantially remove) the first spacer 116 is performed. The etch process may be, for example, an anisotropic etch process.

Figure 14A:
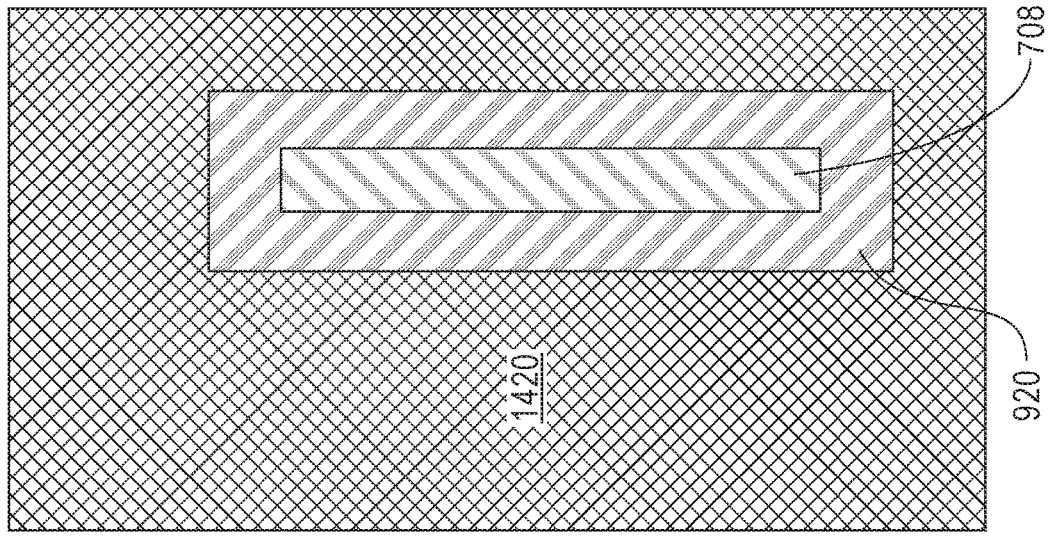
FIG. 14A is a top view of FIG. 14.
Figure 14:
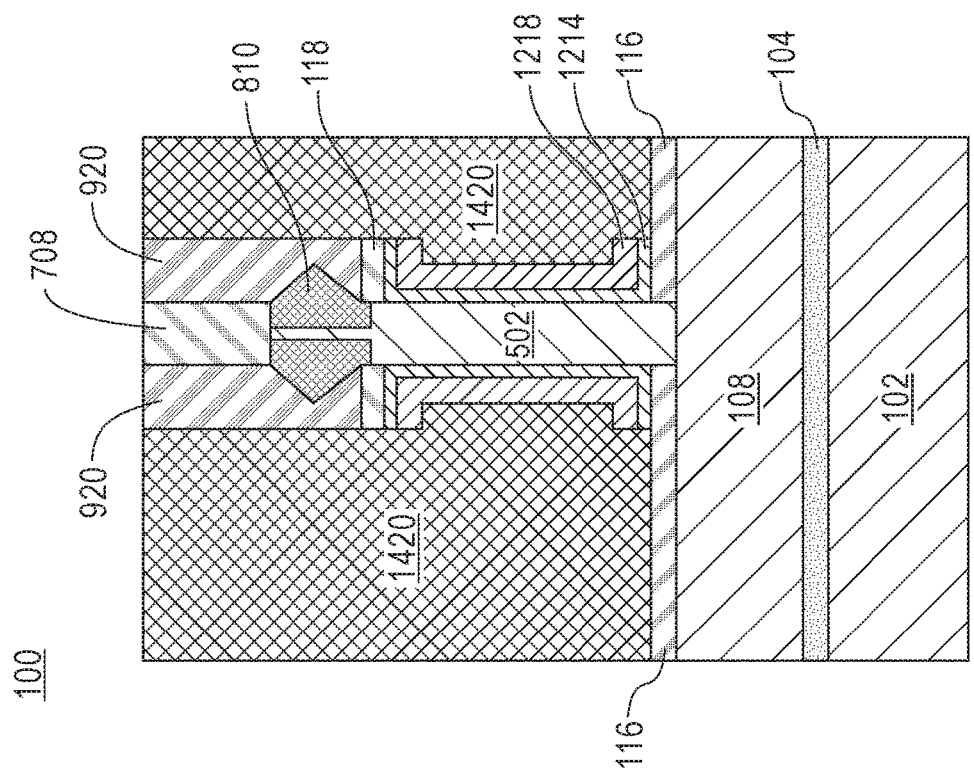
FIG. 14 is a cross-sectional view of the semiconductor device after filling with a metal gate material and conducting a planarization process on the metal gate material, according to an embodiment of the present disclosure.

Referring now to FIG. 14, a cross-sectional view of the semiconductor device 100 after filling with a metal gate material 1420 and conducting a planarization process on the metal gate material 1420 is shown, according to an embodiment of the present disclosure. In this embodiment, FIG. 14A is a top view of the semiconductor device 100. The metal gate material 1420 is a conductive gate metal that is deposited over the gate dielectric material(s) 1214 and work function metals 1218 to form the gate stack. Non-limiting examples of suitable conductive metals include aluminum (Al), platinum (Pt), gold (Au), tungsten (W), titanium (Ti), or any combination thereof. The conductive metal forming the metal gate material 1420 may be deposited by a suitable deposition process such as, for example, CVD, PECVD, PVD, plating, thermal or e-beam evaporation, and sputtering. A planarization process, for example, CMP, is performed to polish the surface of the metal gate material 1420.

Figure 15A:
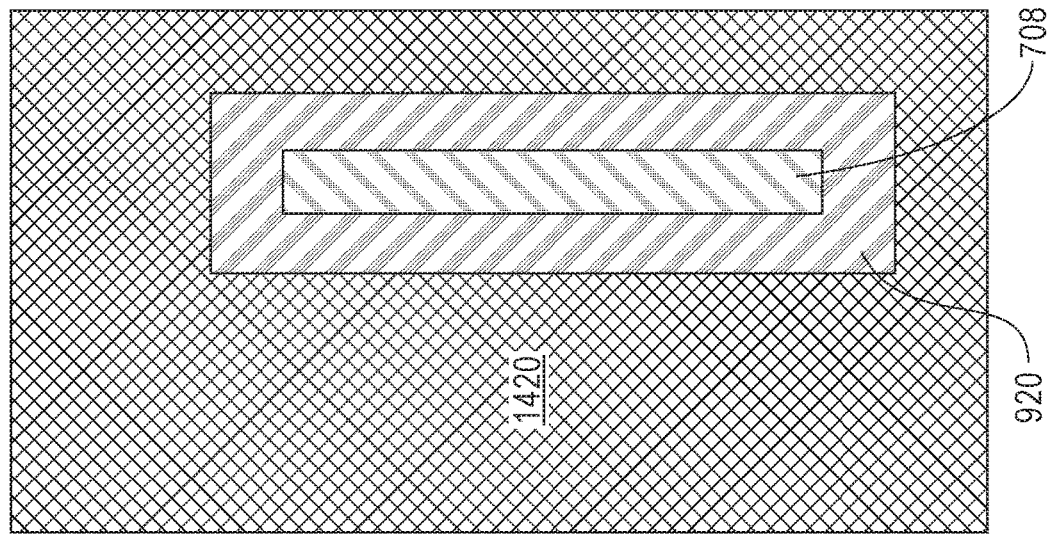
FIG. 15A is a top view of FIG. 15.
Figure 15:
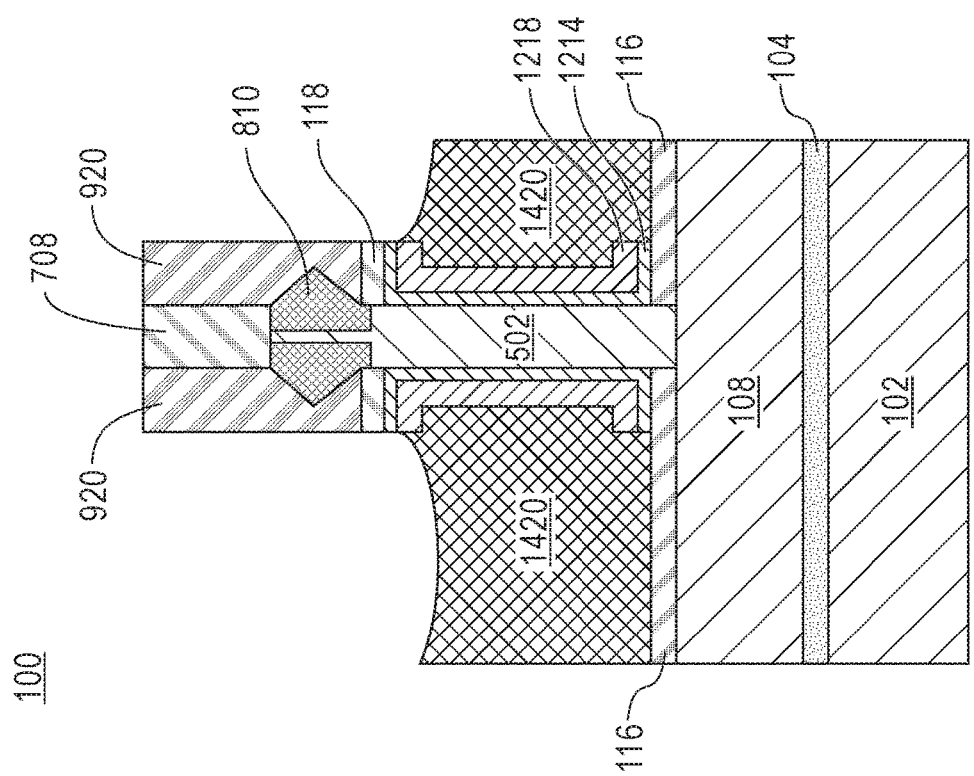
FIG. 15 is a cross-sectional view of the semiconductor device after partially recessing the metal gate material, according to an embodiment of the present disclosure.

Referring now to FIG. 15, a cross-sectional view of the semiconductor device 100 after partially recessing the metal gate material 1420 is shown, according to an embodiment of the present disclosure. In this embodiment, FIG. 15A is a top view of the semiconductor device 100. The metal gate material 1420 is partially recessed by an etch process such as, for example, a reactive ion etch process.

Figure 16A:
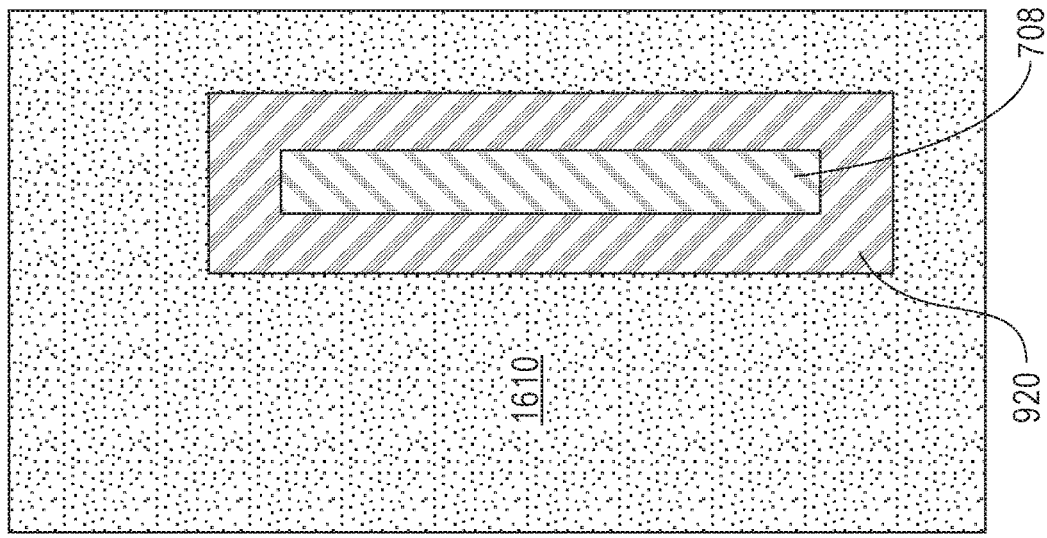
FIG. 16A is a top view of FIG. 16.
Figure 16:
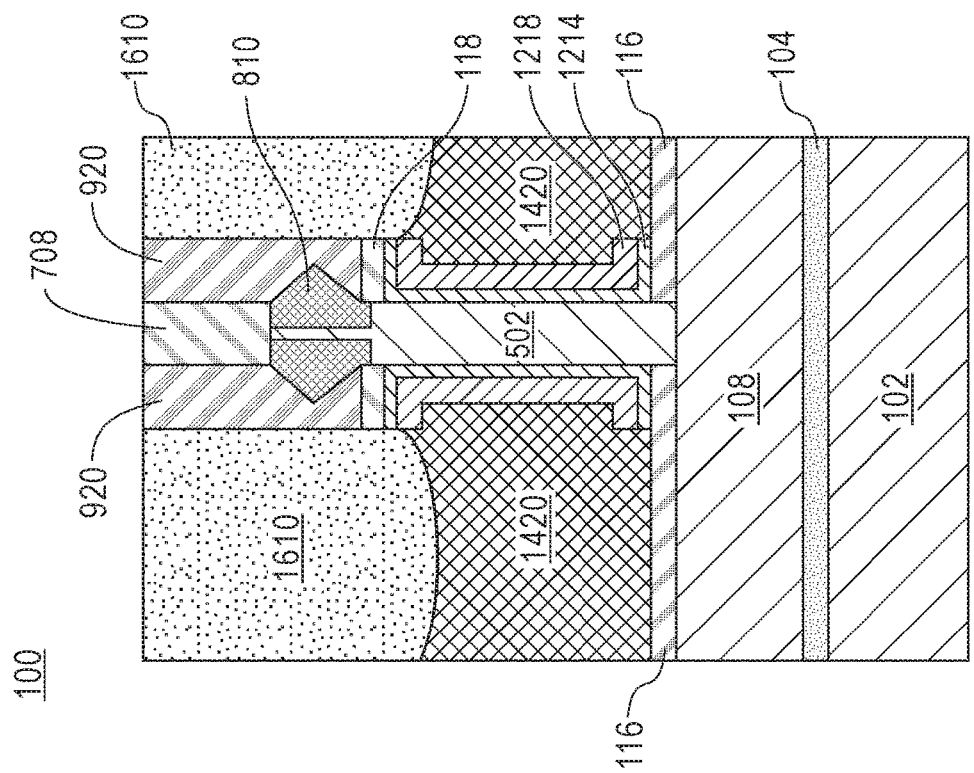
FIG. 16 is a cross-sectional view of the semiconductor device after depositing a first interlevel dielectric layer on the metal gate material and conducting a planarization process, according to an embodiment of the present disclosure.

Referring now to FIG. 16, a cross-sectional view of the semiconductor device 100 after depositing a first interlevel dielectric (ILD) layer 1610 on the metal gate material 1420 and conducting a planarization process is shown, according to an embodiment of the present disclosure. In this embodiment, FIG. 16A is a top view of the semiconductor device 100. The first ILD layer 1610 may be formed from, for example, a low-k dielectric material (with k<4.0), including but not limited to, silicon oxide, spin-on-glass, a flowable oxide, a high density plasma oxide, borophosphosilicate glass (BPSG), or any combination thereof. The first ILD layer 1610 is deposited by a deposition process, including, but not limited to CVD, PVD, PECVD, ALD, evaporation, chemical solution deposition, or like processes.

Figure 17A:
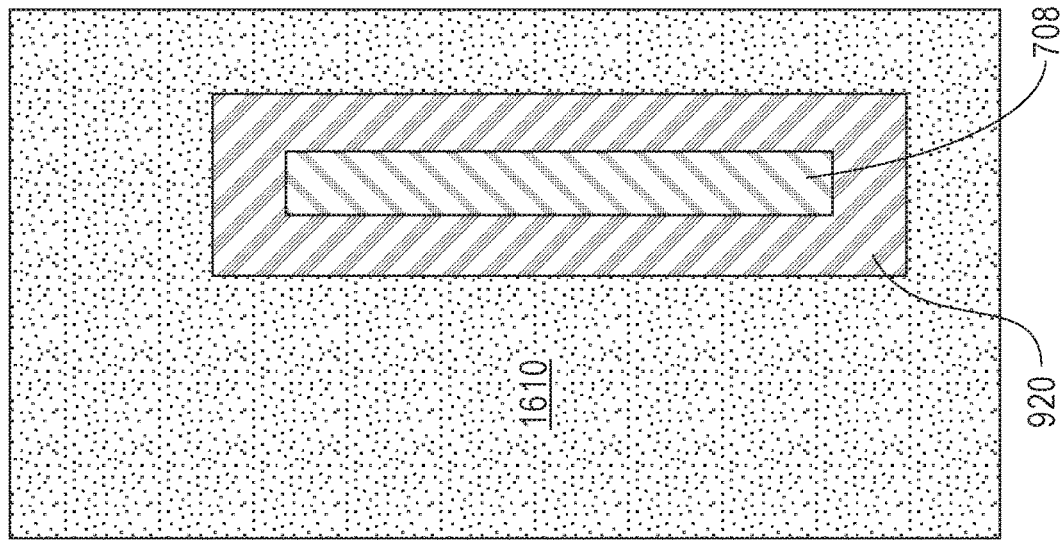
FIG. 17A is a top view of FIG. 17.
Figure 17:
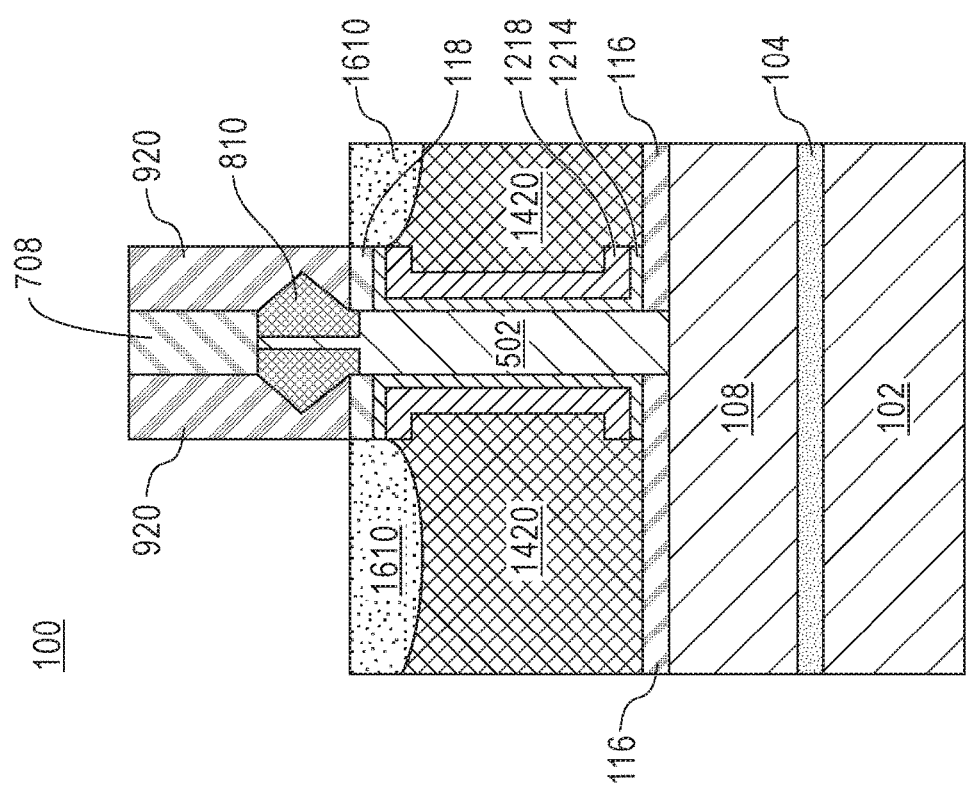
FIG. 17 is a cross-sectional view of the semiconductor device after partially recessing the first interlevel dielectric layer, according to an embodiment of the present disclosure.

Referring now to FIG. 17, a cross-sectional view of the semiconductor device 100 after partially recessing the first ILD layer 1610 is shown, according to an embodiment of the present disclosure. In this embodiment, FIG. 17A is a top view of the semiconductor device 100. The first ILD layer 1610 is partially recessed by any suitable etching process such as, for example, a reactive ion etch process. The recessing of the first ILD layer 1610 exposes the spacer 920 in preparation for its removal.

Figure 18A:
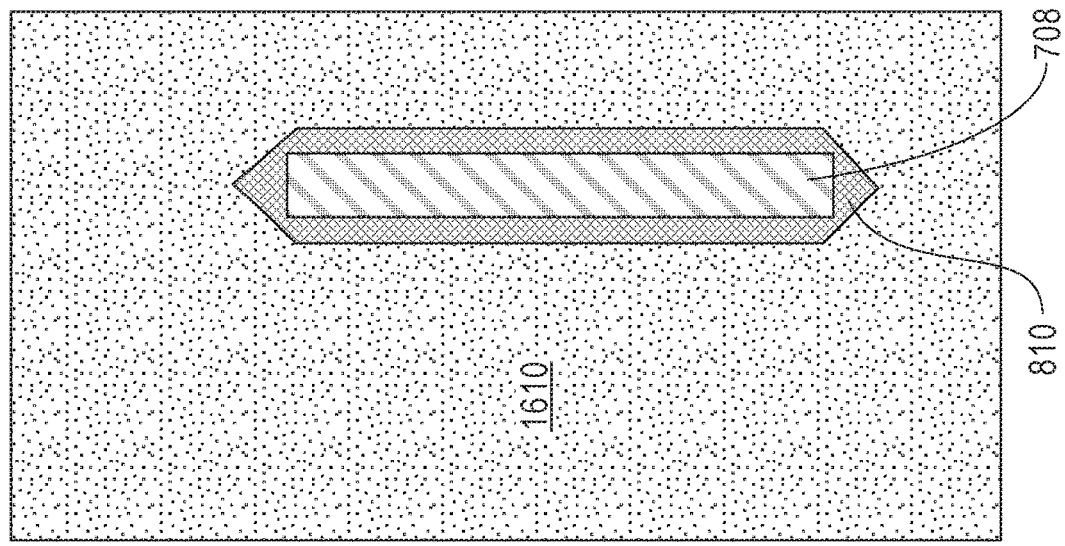
FIG. 18A is a top view of FIG. 18.
Figure 18:
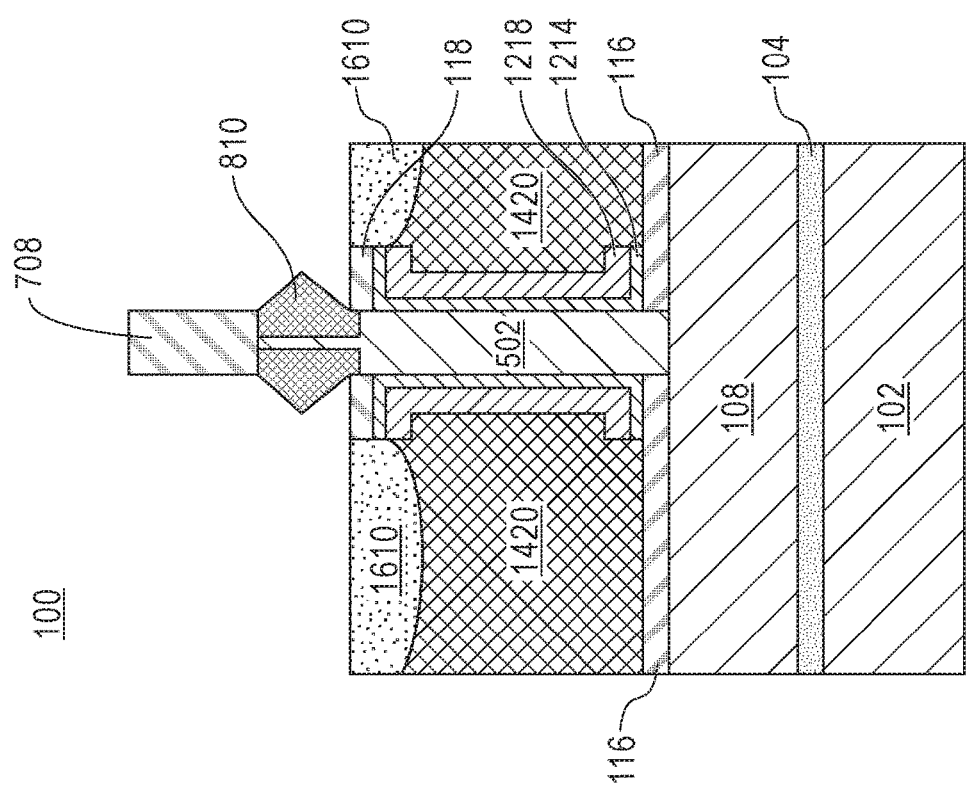
FIG. 18 is a cross-sectional view of the semiconductor device 100 after removing the spacer, according to an embodiment of the present disclosure.

Referring now to FIG. 18, a cross-sectional view of the semiconductor device 100 after removing the spacer 920 is shown, according to an embodiment of the present disclosure. In this embodiment, FIG. 18A is a top view of the semiconductor device 100. The spacer 920 can be removed by any suitable etching process. Removal of the spacer 920 exposes the epitaxial region 810 and dielectric cap 708, as illustrated in the figure.

Figure 19A:
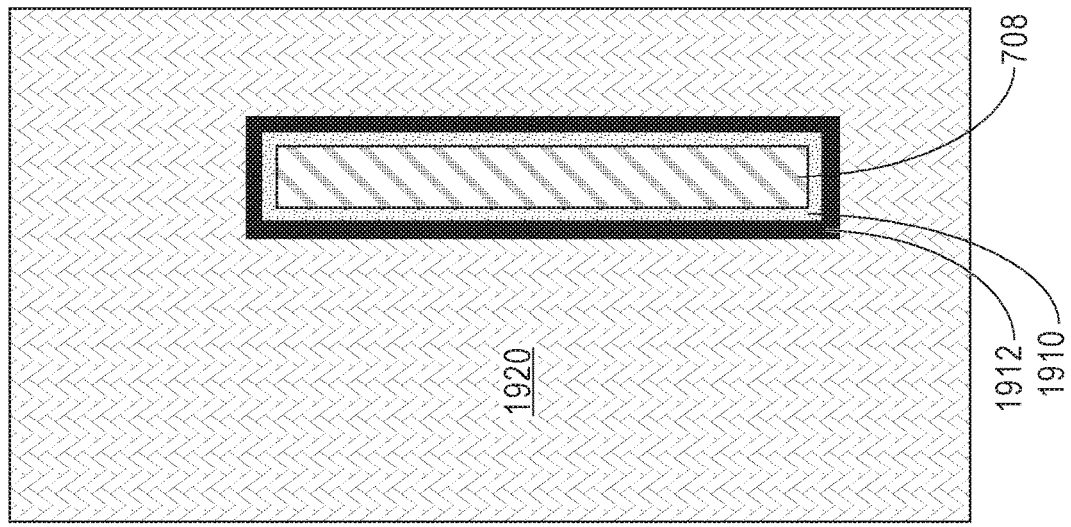
FIG. 19A is a top view of FIG. 19.
Figure 19:
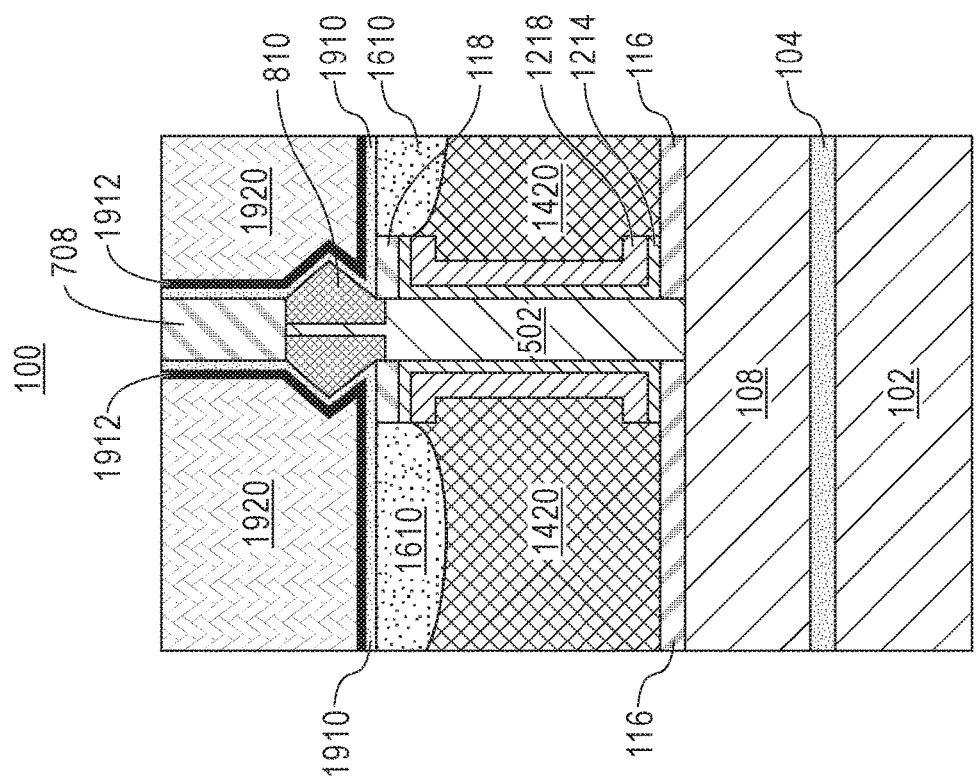
FIG. 19 is a cross-sectional view of the semiconductor device after forming a resistive random access memory stack, according to an embodiment of the present disclosure.

Referring now to FIG. 19, a cross-sectional view of the semiconductor device 100 after forming a resistive random access memory (ReRAM) stack is shown, according to an embodiment of the present disclosure. In this embodiment, FIG. 19A is a top view of the semiconductor device 100. In this embodiment, a simplistically depicted ReRAM stack includes an oxide layer 1910, an electrode layer 1912 above the oxide layer 1090, and a metal fill 1920 above the electrode layer 1912. The oxide layer 1910 is conformally deposited along exposed top surfaces of the first ILD layer 1610 and epitaxial region 810 (sour/drain region), as well as exposed sidewalls of the dielectric cap 708.

The oxide layer 1910 may be conformally deposited using know deposition techniques such as, for example, ALD. The oxide layer 1910 may be made of a metal oxide material or high-k materials. Non-limiting examples of suitable materials for the oxide layer 1910 may include titanium oxide, tantalum oxide, and hafnium oxide. The oxide layer 1910 serves as a dielectric layer for ReRAM structures, separating the epitaxial region 810 from the electrode layer 1912.

The electrode layer 1912 is conformally deposited on top of the oxide layer 1910. The electrode layer 1912 may be deposited using known deposition techniques, such as, for example, ALD. The electrode layer 1912 may be made of materials such as titanium nitride and aluminum doped titanium nitride. It should be noted that, in this embodiment, the electrode layer 1912 serves as a top electrode of the ReRAM structure, whereas the epitaxial region 810 may serve two functions. Specifically, the epitaxial region 810 functions as a top source/drain region of the VFET device, with the doped source 108 acting as the bottom source/drain region of the VFET device. Further, the epitaxial region 810 also functions as bottom electrode of the ReRAM structure.

Once the electrode layer 1912 is conformally deposited above the oxide layer 1910, a metal fill 1920 is deposited above the electrode layer 1912. After depositing the metal fill 1920, the semiconductor device 100 undergoes a CMP process to obtain the smooth and flat surface shown in the figure. The metal fill 1920 may be made of suitable low resistivity metals, such as, for example, tungsten or copper. The metal fill 1920 serves as a conductor of electricity between the electrode layer 1912 and contacts subsequently formed on a top surface of the metal fill 1920.

Referring now to FIG. 20, a cross-sectional view of the semiconductor device 100 after performing gate lithography and etching is shown, according to an embodiment of the present disclosure. In this embodiment, FIG. 20A is a top view of the semiconductor device 100.

A mask (not shown) may be disposed on the metal fill 1920 and subsequently patterned. As may be understood the process of gate lithography and etching is performed simultaneously with etching of the ReRAM stack (e.g., oxide layer 1910, electrode layer 1912, and metal fill 1920. As known by those skilled in the art, a pattern is transferred into the metal fill 1920 and metal gate material 1420 removing portions of the metal fill 1920 and metal gate material 1420, and exposing a portion of the first spacer 116, as shown in the figure. In some embodiments, a combination of RIE processes may be performed to remove portions of the ReRAM stack, first ILD layer 1610 and the metal gate material 1420.

Figure 21A:
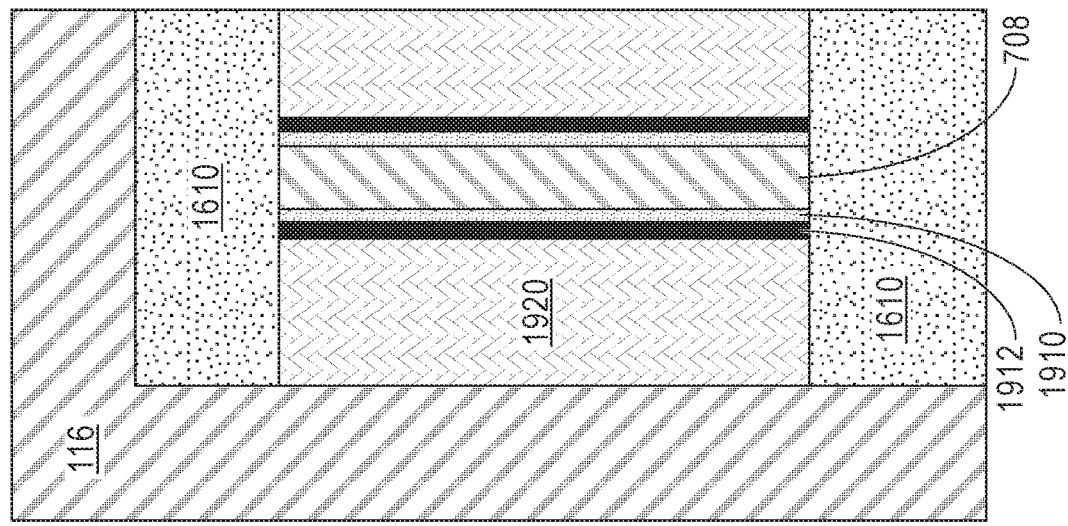
FIG. 21A is a top view of FIG. 21.
Figure 21:
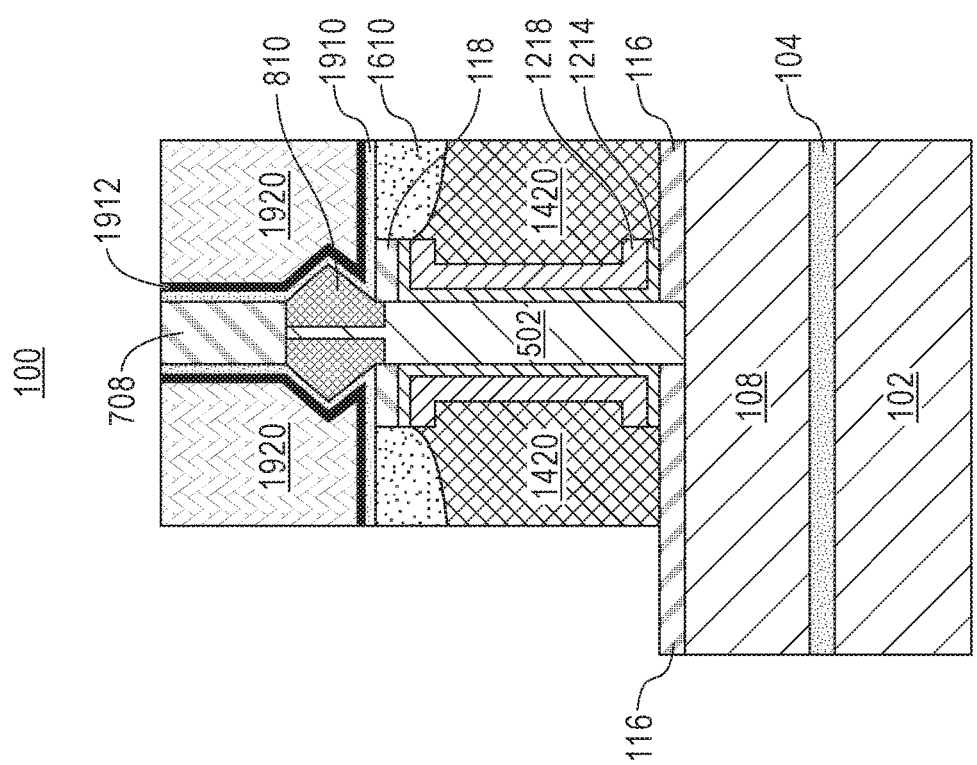
FIG. 21 is a cross-sectional view of the semiconductor device after further etching the first interlevel dielectric layer, according to an embodiment of the present disclosure.

It should be noted that, during lithography and patterning of the metal gate material 1420 and ReRAM stack, the ReRAM stack is further recessed to expose portions of the first ILD layer 1610 but not of the metal gate material 1420 as can be observed in FIG. 21A. As illustrated in FIGS. 21 and 21A, only opposing portions of the first ILD layer 1610 are exposed in preparation for (gate) contact patterning.

Figure 22A:
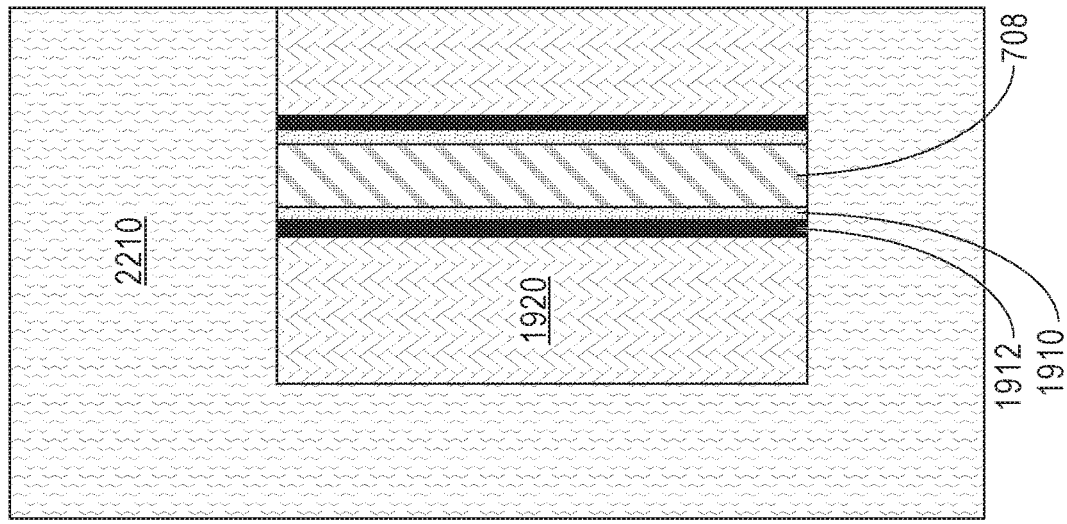
FIG. 22A is a top view of FIG. 22.
Figure 22:
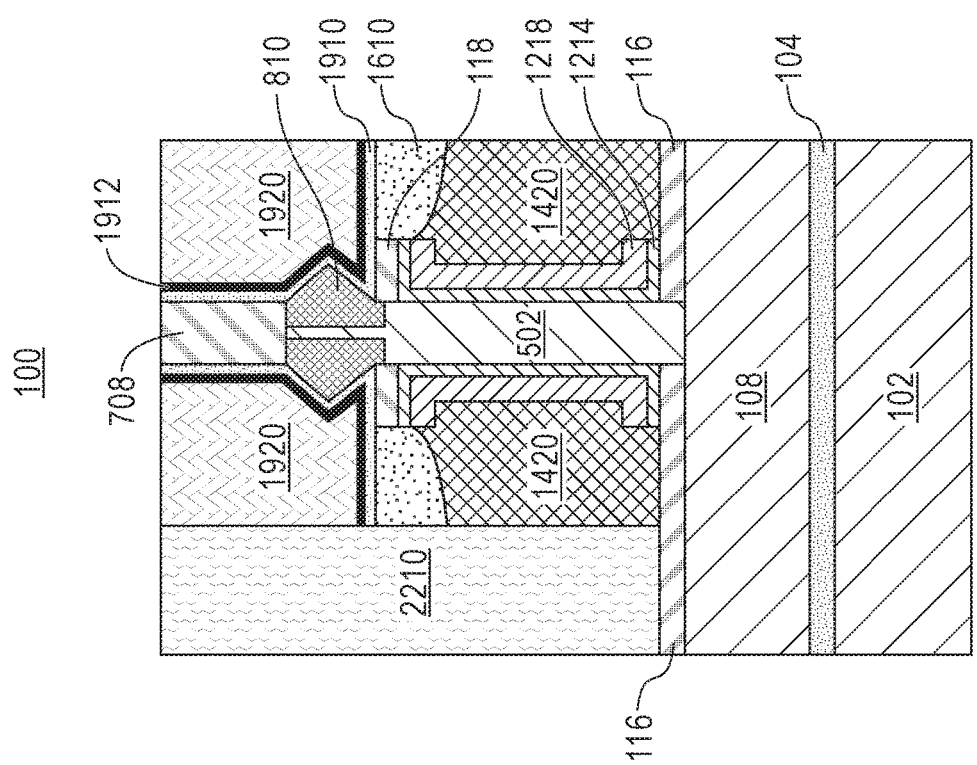
FIG. 22 is a cross-sectional view of the semiconductor device after depositing a second interlevel dielectric layer, according to an embodiment of the present disclosure.

Referring now to FIG. 22, a cross-sectional view of the semiconductor device 100 after forming a second ILD layer 2210 is shown, according to an embodiment of the present disclosure. In this embodiment, FIG. 22A is a top view of the semiconductor device 100. A dielectric material, similar to the one forming the first ILD layer 1610, is deposited to fill recesses in the semiconductor device 100. The deposited dielectric material forms the second ILD layer 2210 which includes analogous materials and is formed in a similar way as the first ILD layer 1610.

Referring now to FIG. 23, a cross-sectional view of the semiconductor device 100 after forming source/drain contacts 2310, gate contacts 2312 and ReRAM contacts 2314 is shown, according to an embodiment of the present disclosure. In this embodiment, FIG. 22A is a top view of the semiconductor device 100. Source/drain contacts 2310 extends through the second ILD layer 2210 and the first spacer 116 to the doped source 108 and are formed within a trench (not shown). The process of forming source/drain contacts is standard and well-known in the art. Typically, the process includes filling the trench with a conductive material or a combination of conductive materials to form the source/drain contacts 2310. The conductive material filling the source/drain contacts 2310 includes a conductive metal, for example, aluminum (Al), platinum (Pt), gold (Au), tungsten (W), titanium (Ti), or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from the surface of the second ILD layer 2210.

The gate contacts 2312 (shown in FIG. 23A) extend from a surface of the second ILD layer 2210 through the first ILD layer 1610 to the metal gate material 1420. The process of forming the gate contacts 2312 is standard and well-known in the art. The process generally includes forming a trench (not shown) in the second ILD layer 2210 and first ILD layer 1610 to the metal gate material 1420 using suitable etching processes, and filling the trench with a conductive material or a combination of conductive materials to form the gate contacts 2312. The conductive material forming the gate contacts 2312 may be a conductive metal, for example, aluminum (Al), platinum (Pt), gold (Au), tungsten (W), titanium (Ti), or any combination thereof deposited by a suitable deposition process, for example, CVD, PECVD, PVD, plating, thermal or e-beam evaporation, or sputtering. A planarization process, for example, CMP, is performed to remove any conductive material from the surface of the second ILD layer 2210.

ReRAM contacts 2314 may be subsequently formed above and in direct contact with the metal fill 1920. The ReRAM contacts may be made of a conductive metal including, for example, aluminum (Al), platinum (Pt), gold (Au), tungsten (W), titanium (Ti), or any combination thereof.

Accordingly, the final semiconductor device 100, includes a vertical field effect transistor with one ReRAM element or structure on each side of the epitaxial region 810 separated by the dielectric cap 708. As depicted in the figure, both of the ReRAM structures positioned on opposite sides of the dielectric cap 708 and epitaxial region 810 includes an angled region protruding outwardly towards the metal fill 1920 defined by the triangular shape of the epitaxial region 810, the oxide layer 1910, and the electrode layer 1912. As described above, this angled region is the result of the faceted epitaxial growth of the epitaxial region 810. More specifically, the epitaxial region 810 includes a diamond-shaped faceting effect consequence of a differential growth along different crystallographic planes that causes the two opposing protruding regions of the epitaxial region 810 be bounded by <111> planes. The protruding angled region of the ReRAM structures enhances the electroforming of the current conducting filament. Accordingly, the randomness of electroforming of the current conducting filament is reduced in the proposed ReRAM structure. In addition, having the VFET integrated with the ReRAM structures saves space, and allows for fabrication of more VFETs on the same footprint.

Therefore, embodiments of the present disclosure provide a semiconductor device, and a method of making the same, that includes two ReRAM elements integrated vertically on opposite sides of a top portion of a VFET device. Specifically, in the proposed embodiments, each memory cell in the final semiconductor device includes two resistive memory elements and one selector (1T-2R) that allows for a reduced footprint. The bottom electrode of the resistive memory elements is the top source/drain region of the vertical field effect transistor. The proposed semiconductor device also includes a channel region made of a single-crystalline semiconductor material which further enhances device performance.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A vertical field effect transistor, comprising:
   a channel region extending from a doped source on a substrate;
   a metal gate material disposed on and around the channel region between a first spacer and a second spacer;
   a first interlevel dielectric layer adjacent to the second spacer;
   a top source/drain region comprising an epitaxial region above the channel region, the epitaxial region being separated from the channel region by the second spacer, the epitaxial region comprising two opposing protruding regions of triangular shape extending outwardly from the channel region;
   a dielectric cap above a top surface of the epitaxial region;
   an oxide layer conformally deposited on a top surface of the first interlevel dielectric layer, a top surface of the second spacer, a top surface of each protruding region of the epitaxial region and on sidewalls of the dielectric cap;
   a top electrode layer conformally deposited on the oxide layer; and
   and a metal fill deposited above the top electrode layer for forming a resistive random access memory element on each side of the epitaxial region, each protruding region of the epitaxial region of the top source/drain region acting as a bottom electrode for the resistive random access memory element on each side of the epitaxial region.

2. The vertical field effect transistor of claim 1, wherein the epitaxial region comprises a diamond-shaped faceting effect consequence of a differential growth along different crystallographic planes that causes the two opposing protruding regions of the epitaxial region be bounded by <111> planes.

3. The vertical field effect transistor of claim 1, wherein the resistive random access memory element on each side of the epitaxial region are integrated vertically on opposing sides of a top portion of the vertical field effect transistor for forming a one-transistor-two-resistor (1T2R) resistive random access memory structure.

4. The vertical field effect transistor of claim 1, further comprises:
   a counter-doped layer between the substrate and the doped source, wherein the doped source comprises a first dopant, and the counter-doped layer comprises a second dopant that is different than the first dopant.

5. The vertical field effect transistor of claim 1, further comprising:
   a second interlevel dielectric layer for contact formation, the second interlevel dielectric layer formed above the first spacer adjacent to the resistive random access memory element and the first interlevel dielectric later.

6. The vertical field effect transistor of claim 1, further comprising:
   a source/drain contact contacting the doped source;
   a gate contact contacting the metal gate material; and
   two resistive random access memory contacts contacting a top portion of the metal fill.

* * * * *